United States Patent
Otsuka et al.

(10) Patent No.: US 9,831,868 B2
(45) Date of Patent: *Nov. 28, 2017

(54) DRIVING CIRCUIT FOR DRIVING A PIEZOELECTRIC ELEMENT

(71) Applicant: Seiko Epson Corporation, Tokyo (JP)

(72) Inventors: Shuji Otsuka, Shiojiri (JP); Tadashi Kiyuna, Hachioji (JP); Toshifumi Asanuma, Hamura (JP)

(73) Assignee: Seiko Epson Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/150,690

(22) Filed: May 10, 2016

(65) Prior Publication Data

US 2016/0254811 A1  Sep. 1, 2016

Related U.S. Application Data

(63) Continuation of application No. 14/708,531, filed on May 11, 2015, now Pat. No. 9,358,782.

(30) Foreign Application Priority Data

May 26, 2014 (JP) ................................. 2014-107999

(51) Int. Cl.
| | |
|---|---|
| B41J 2/045 | (2006.01) |
| H03K 17/687 | (2006.01) |
| B41J 2/14 | (2006.01) |
| H03K 19/0175 | (2006.01) |

(52) U.S. Cl.
CPC ........ *H03K 17/6871* (2013.01); *B41J 2/0452* (2013.01); *B41J 2/04541* (2013.01); *B41J 2/04581* (2013.01); *B41J 2/04588* (2013.01); *B41J 2/04593* (2013.01); *B41J 2/04596* (2013.01); *B41J 2/14201* (2013.01); *H03K 19/017509* (2013.01)

(58) Field of Classification Search
None
See application file for complete search history.

(56) References Cited

U.S. PATENT DOCUMENTS

| | | | |
|---|---|---|---|
| 2004/0169545 A1* | 9/2004 | Aiba | ...................... B41J 2/0452 327/530 |
| 2005/0052201 A1* | 3/2005 | Bernard | ............... H03K 17/102 326/82 |
| 2007/0124620 A1 | 5/2007 | Miyazaki | |
| 2007/0216482 A1 | 9/2007 | Hollenbeck et al. | |
| 2008/0238963 A1 | 10/2008 | Otsuka | |

(Continued)

FOREIGN PATENT DOCUMENTS

| | | |
|---|---|---|
| JP | 2004-153411 A | 5/2004 |
| JP | 2009-190287 A | 8/2009 |
| JP | 2010-114711 A | 5/2010 |

*Primary Examiner* — Erica Lin
(74) *Attorney, Agent, or Firm* — Harness, Dickey & Pierce, P.L.C.

(57) ABSTRACT

A drive signal generator includes a drive signal generator that generates a drive signal for driving a capacitive load. In the drive signal generator, a set of a first MOSFET and a second MOSFET which are electrically connected in series between a wire of a high potential and a wire of a low potential is arranged in plurality in series. A part or all of the first MOSFETs and the second MOSFETs in the plurality of sets have different sizes from each other.

9 Claims, 20 Drawing Sheets

(56) References Cited

U.S. PATENT DOCUMENTS

2009/0039869 A1* 2/2009 Williams .......... H01L 23/49575
 324/123 R
2009/0206888 A1 8/2009 Kitazawa et al.
2014/0070665 A1* 3/2014 Muggler .................. G06F 1/32
 310/314

* cited by examiner

<FIRST STATUS: CHARGING>

<SECOND STATUS: CHARGING>

<SECOND STATUS: DISCHARGING>

<FIRST STATUS: DISCHARGING>

<STATUS A (SELECTION OF TERMINAL a)>

<STATUS B (SELECTION OF TERMINAL b)>

<COMPARATIVE EXAMPLE>

<EMBODIMENT>

<SIZE COMPARISON OF TRANSISTORS>

DRIVING CIRCUIT FOR DRIVING A PIEZOELECTRIC ELEMENT

This is a continuation patent application of U.S. application Ser. No. 14/708,531, filed May 11, 2015, which claims priority to Japanese Patent Application No. 2014-107999, filed May 26, 2014, both of which are incorporated by reference herein in their entireties.

BACKGROUND

1. Technical Field

The present invention relates to a liquid discharge apparatus.

2. Related Art

As an ink jet printer that discharges ink and prints an image or a document, a printer that uses piezoelectric elements (for example, piezo elements) is known. The piezoelectric elements are provided corresponding to a plurality of nozzles in a head unit (print head), respectively, and are driven in accordance with drive signals, respectively, and thereby a predetermined amount of ink (liquid) is discharged from the nozzle at a predetermined timing. The piezoelectric element is a capacitive load like a capacitor in terms of electric power. Therefore, a sufficient current needs to be supplied so as to operate the piezoelectric element of each nozzle.

Therefore, in the related art, a configuration is known, in which a source drive signal of the drive signal to be generated is amplified by using an amplifier circuit and the amplified drive signal is supplied to the head unit such that the piezoelectric element is driven. Examples of the amplifier circuit include a system of performing current amplification of the source drive signal by using a class AB amplifier or the like (linear amplification system, see JP-A-2009-190287) or a system of demodulating by using a low pass filter after pulse width modulation, pulse density modulation, or the like of the source drive signal (class D amplification system, see JP-A-2010-114711). In addition, a system of switching a voltage that is applied to a piezoelectric element into a plurality of levels (voltage switching system, see JP-A-2004-153411) is also proposed, in addition to a configuration in which the source drive signal is amplified by using the amplifier circuit.

However, the linear amplification system results in high power consumption and poor energy efficiency. The class D amplification system achieves higher energy efficiency, compared to the linear amplification system, but has a problem of an occurrence of electromagnetic interference (EMI) because high currents are switched at a high frequency. In addition, in the voltage switching system described above, power saving is achieved to some extent, but still has to be improved.

SUMMARY

An advantage of some aspects of the invention is to provide a liquid discharge apparatus of which power consumption is reduced and components and size are optimized.

A liquid discharge apparatus according to an aspect of the invention includes: a drive signal generator that generates a drive signal; a piezoelectric element that is displaced in response to a voltage of the drive signal; a cavity which is filled with a liquid and of which an inside volume is expanded and contracted due to the displacement of the piezoelectric element; and a nozzle that communicates with the cavity and is capable of discharging the liquid by the expansion and contraction of the inside volume of the cavity. In the drive signal generator, a set of a first MOSFET and a second MOSFET which are electrically connected in series between a wire of a high potential and a wire of a low potential is arranged in plurality in series. A part or all of the first MOSFETs and the second MOSFETs in the plurality of sets have different sizes from each other.

According to the aspect, since charging of and discharging from the piezoelectric element proceed in a stepwise manner, it is possible to improve energy efficiency, compared to a configuration in the related art in which the charging and discharging are performed at a time. In addition, since the switching is not performed on a high current like a current of the class D amplification, it is possible to prevent an occurrence of EMI. Further, according to the aspect, the plurality of sets of the first MOSFETs and the second MOSFETs satisfy requirements, respectively, and is optimized in size.

The size of the MOSFET means an area of the MOSFET formed of a semiconductor (die) in a plan view, and specifically, an area of a drain region, a gate region, and a source region.

In this case, among the first MOSFETs and the second MOSFETs in the plurality of sets, the first MOSFET in a set which has the highest potential of the corresponding wire of the high potential may have the smallest size.

This is because, in the first MOSFET, a diode for backflow prevention may not be provided and thus, even when the first MOSFET has a small size, the first MOSFET copes with current increase on the high potential.

In this case, the piezoelectric element may be charged by a first MOSFET in a set of the plurality of sets, and the piezoelectric element may be discharged by a second MOSFET in the set.

In this case, a size of the first MOSFET in the set may be smaller than a size of the second MOSFET in the set.

In addition, in this case, in another set that is different from the set, a MOSFET that performs discharging of the piezoelectric element by a lower potential than a potential by which the second MOSFET in the set performs the discharging may have a greater size than the second MOSFET in the set.

In this case, each of the wires of the high potential and the wires of the low potential corresponding to the plurality of sets may be connected to an auxiliary power supply circuit that supplies and collects charge. According to the configuration, during the charging of the piezoelectric element, it is possible to reuse the collected charge and thus, it is possible to achieve low power consumption.

In this case, the drive signal generator may control a voltage of the drive signal by using one MOSFET in the plurality of sets, in response to a voltage of a source drive signal that controls the voltage of the drive signal and a hold voltage of the piezoelectric element. According to the configuration, not only the voltage of the source drive signal but also the hold voltage of the piezoelectric element, that is, the output voltage is fed-back and the voltage of the drive signal is controlled. Therefore, it is possible to drive the piezoelectric element with high accuracy.

In this case, the plurality of sets may have level shifters, respectively, each of which applies, to a gate electrode of the first MOSFET, a voltage that is obtained by shifting the voltage of the source drive signal by a predetermined value to a high potential side and applies, to a gate electrode of the second MOSFET, a voltage that is obtained by shifting the voltage of the source drive signal by a predetermined value to a low potential side, in a case where one end of the piezoelectric element has a potential at least in a corresponding range between the low potential or more and less than the high potential.

In addition, in this case, among the plurality of sets, the size of the first MOSFET in a set may be different from the size of the second MOSFET in the same set.

BRIEF DESCRIPTION OF THE DRAWINGS

The invention will be described with reference to the accompanying drawings, wherein like numbers reference like elements.

FIG. 4 is a diagram illustrating an example of a waveform of a source drive signal, a drive signal, or the like.

DESCRIPTION OF EXEMPLARY EMBODIMENTS

First, a printing apparatus to which an embodiment according to the invention is applied is described.

The printing apparatus is an ink jet printer, that is, a liquid discharge apparatus, which discharges ink according to image data supplied from an external host computer such that an ink dot group is formed on a printing medium such as paper, and thereby prints an image (including a text, a figure, or the like) in accordance with the image data.

Figure 1:
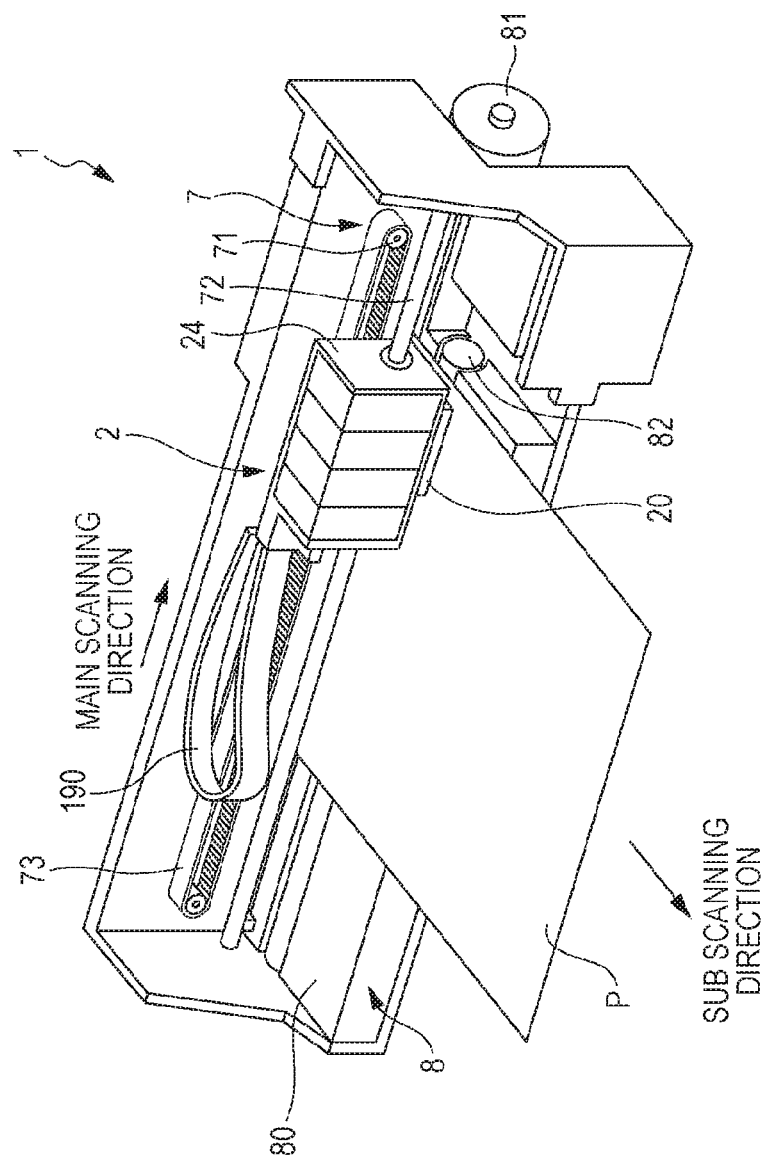
FIG. 1 is a view schematically illustrating a configuration of a printing apparatus as an exemplary embodiment.

FIG. 1 is a perspective view schematically illustrating a configuration of a printing apparatus.

As illustrated in FIG. 1, the printing apparatus 1 includes a moving mechanism 7 that causes a moving body 2 to move (reciprocate) in a main scanning direction.

The moving mechanism 7 includes a carriage motor 71 which becomes a drive source of the moving body 2, a carriage guide shaft 72 of which opposite ends are fixed, and a timing belt 73 that extends substantially in parallel with the carriage guide shaft 72 and is driven by the carriage motor 71.

A carriage 24 of the moving body 2 is supported by the carriage guide shaft 72 in a reciprocating manner and is fixed to a part of the timing belt 73. Therefore, when the timing belt 73 is caused to perform forward and reverse travelling by the carriage motor 71, the moving body 2 is guided by the carriage guide shaft 72 and reciprocates.

In addition, a head unit 20 is provided on a portion of the moving body 2 which faces a printing medium P. The head unit 20 discharges ink droplets (liquid droplets) from a plurality of nozzles, as will be described below, and is configured such that various control signals or the like are supplied thereto through a flexible cable 190.

The printing apparatus 1 includes a transport mechanism 8 that transports the printing medium P on a platen 80 in a sub scanning direction substantially orthogonal to the main scanning direction. The transport mechanism 8 includes a transport motor 81 which is a drive source and a transport roller 82 which is caused to rotate by the transport motor 81 and transports the printing medium P in the sub scanning direction.

At a time when the printing medium P is transported by the transport mechanism 8, the head unit 20 discharges an ink droplet on the printing medium P and thereby, an image is formed on a surface of the printing medium P.

Figure 2:
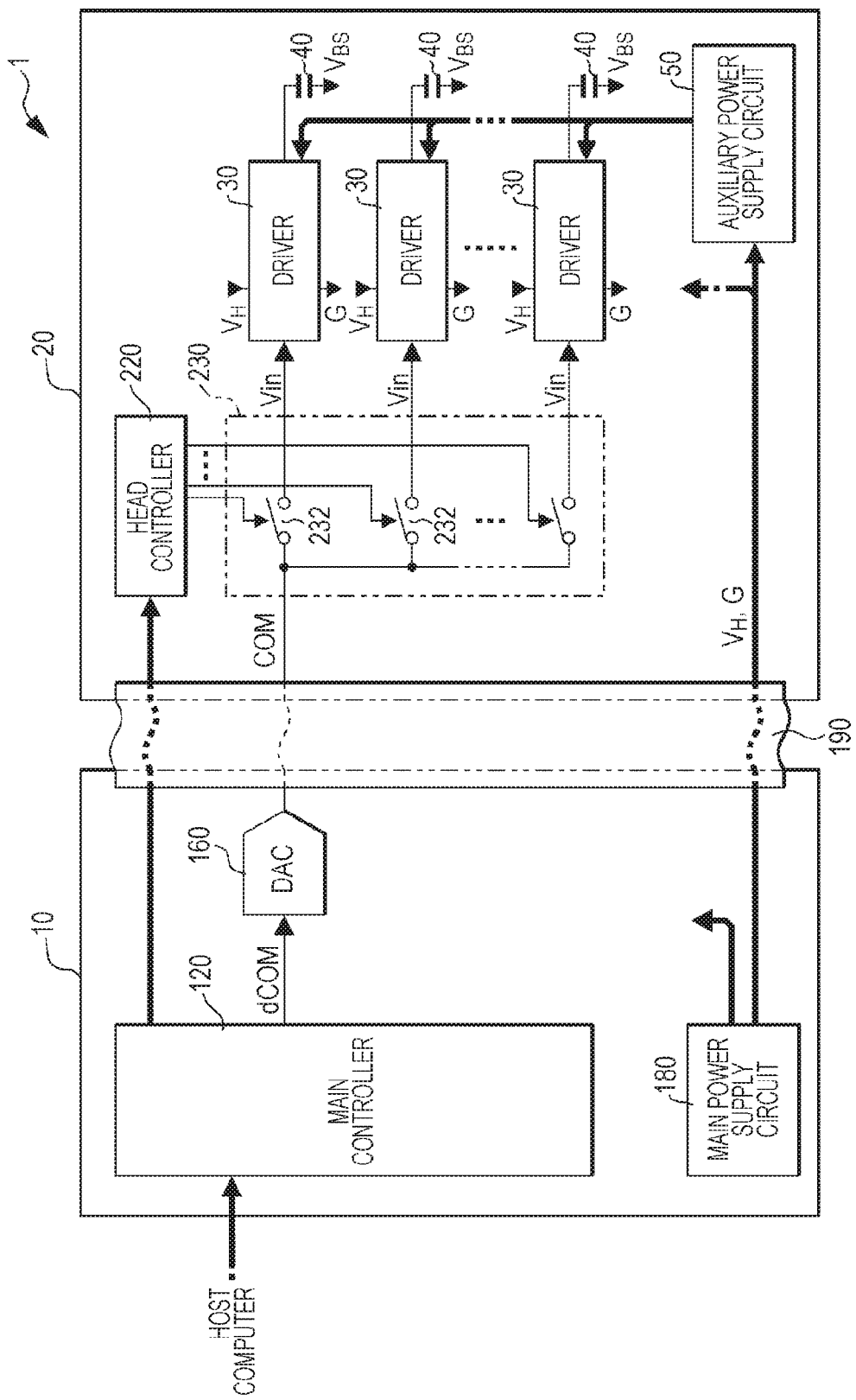
FIG. 2 is a block diagram illustrating a configuration of the printing apparatus.

FIG. 2 is a block diagram illustrating an electrical configuration of the printing apparatus 1.

As illustrated in FIG. 2, the printing apparatus 1 is configured to have a control unit 10 that executes a computing process of printing an image on the basis of the image data supplied from the host computer and the head unit 20 that has a plurality of nozzles. The control unit 10 and the head unit 20 are electrically connected through the flexible cable 190.

The control unit 10 includes a main controller 120, a digital to analog converter (DAC) 160, and a main power supply circuit 180.

The main controller 120 executes a computing process of printing such as an image display process, a color conversion process, an ink color separating process, or a halftoning process on the basis of the image data acquired from the host computer and generates a plurality of types of signals which cause the ink to be discharged from a nozzle of the head unit 20. The plurality of types of signals include digital control data dCOM which is supplied to the DAC 160, or various signals which are supplied to a head controller 220 which will be described below.

Details of each computing process of printing which is executed by the main controller 120 may be executed by the host computer in some cases. Since details of the computing process are well known in the technical field of the printing apparatus, a description thereof is omitted.

In addition, as for the printing apparatus 1, a carriage motor that causes a carriage mounted on the head unit 20 to move in the main scanning direction, a transport motor that transports the printing medium in the sub scanning direction, and the like are included, and as for the control unit 10, a configuration of supplying drive signals to these motors are included.

The DAC 160 converts the control data dCOM into a source analog drive signal COM and supplies the converted signal to the head unit 20.

The main power supply circuit 180 supplies a power supply voltage to each component of the control unit 10 or to the head unit 20 and particularly supplies $V_H$ and G as the power supply voltage to the head unit 20.

The voltage G (ground) is a ground potential, and is a voltage of zero, unless specifically described in descriptions below. In addition, the voltage $V_H$ is on a higher side than the voltage G and is, for example, 42 volts.

One or a plurality of color inks are supplied to the head unit 20 from an ink container through a flow path, though not illustrated specifically. The head unit 20 includes a plurality of sets of drivers 30 and piezoelectric elements (piezo elements) 40, in addition to an auxiliary power supply circuit 50, the head controller 220, and the selection section 230.

The auxiliary power supply circuit 50 generates various voltages by using the power supply voltages $V_H$ and G by the main power supply circuit 180 and feeds the voltages to the plurality of drivers 30 in common. A configuration of the auxiliary power supply circuit 50 will be described in detail.

The head controller 220 controls selection of the selection section 230 in accordance with various signals supplied from the main controller 120.

The selection sections 230 have switches 232 corresponding to the plurality of sets of drivers 30 and piezoelectric elements 40, respectively. While one ends of the switches 232 are connected to one another and are supplied with the source drive signal COM in common, the other ends are connected to input ends of the corresponding drivers 30, respectively. While each switch 232 switches between ON and OFF in accordance with the control by the head controller 220, the source drive signal COM is supplied to the driver 30 during the ON state, and the source drive signal COM is cut off during the OFF state. Therefore, the selection section 230 selects the source drive signal COM supplied from the control unit 10 according to the head controller 220 and supplies the selected signal to the driver 30.

For convenience of description, a source drive signal selected according to the head controller 220 and supplied to the driver 30 among the source drive signals COM is described as Vin.

The driver 30 outputs a drive signal of a voltage Vout in accordance with the source drive signal Vin which is supplied from the selection section 230 by using the various voltages which are supplied from the auxiliary power supply circuit 50 and drives the piezoelectric element 40.

One end of the piezoelectric element 40 is connected to an output end of the corresponding driver 30 and a voltage $V_{BS}$ is applied to the other end of the piezoelectric element 40 in common.

As described above, the piezoelectric element 40 is provided to correspond to each of the plurality of nozzles in the head unit 20 and causes the ink to be discharged by the driving. Next, a configuration of a discharge section which causes the ink to be discharged by driving the piezoelectric element 40 will be described concisely.

Figure 3:
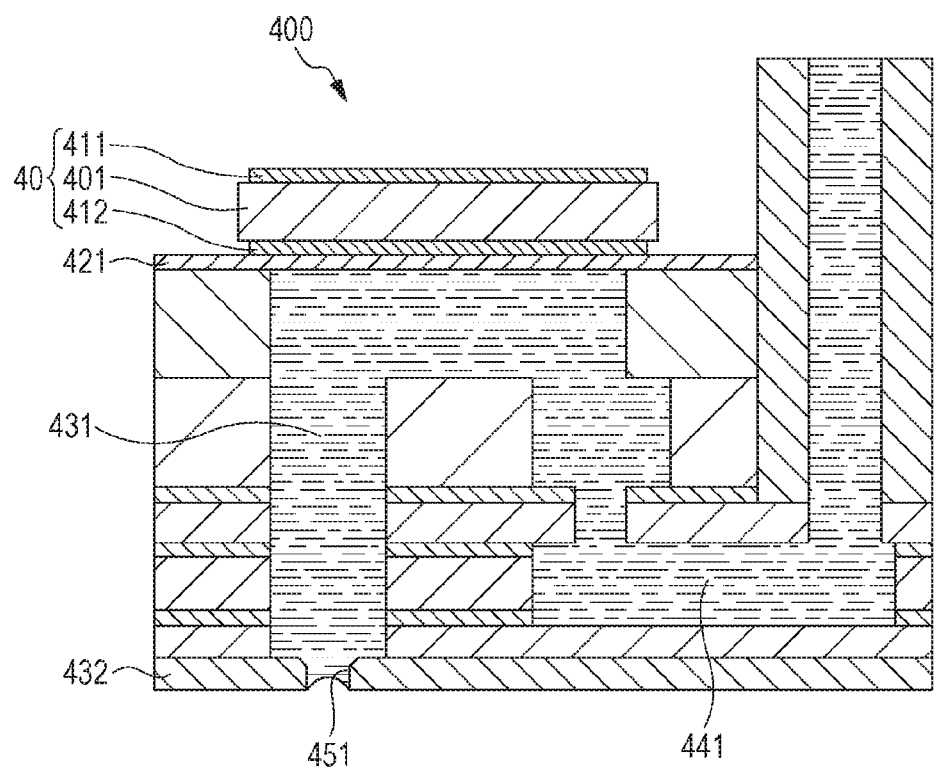
FIG. 3 is a view illustrating a configuration of a discharge section in the head unit.

FIG. 3 is a view schematically illustrating a configuration of a discharge section 400 corresponding to one nozzle in the head unit 20.

As illustrated in FIG. 3, the discharge section 400 includes the piezoelectric element 40, a vibration plate 421, a cavity (pressure chamber) 431, a reservoir 441, and a nozzle 451. The vibration plate 421 is displaced (flexurally vibrated) by the piezoelectric element 40 provided on the top surface in FIG. 3 and functions as a diaphragm that causes an inside volume of the cavity 431 which is filled with the ink to expand/contract. The nozzle 451 is provided in a nozzle plate 432 and is an opening through which communication with the cavity 431 is performed.

The piezoelectric element 40 illustrated in FIG. 3 has a configuration in which a piezoelectric body 401 is interposed between a pair of electrodes 411 and 412. The central portion of the piezoelectric body 401 in the configuration is bent in the vertical direction with respect to both end portions in FIG. 3 in response to the voltage applied by the electrodes 411 and 412, along with the electrodes 411 and 412 and the vibration plate 421. Specifically, the piezoelectric element 40 is configured to be bent upward, for example, when the voltage Vout of the drive signal is high and to be bent downward when the voltage Vout is low. In the configuration, the upward bending causes the inside volume of the cavity 431 to expand, and thus the ink is caused to flow in from the reservoir 441 and the downward bending causes the inside volume of the cavity 431 to contract, and thus the ink is caused to be discharged from the nozzle 451 in response to an extent of the contraction.

The piezoelectric element 40 is not limited to the configuration illustrated in FIG. 3, and may be a type in which the piezoelectric element 40 can be caused to deform such that a liquid such as ink can be discharged. In addition, the piezoelectric element 40 is not limited to a configuration in which the flexural vibration is performed, but may have a configuration in which longitudinal vibration is performed.

In addition, the piezoelectric element 40 is provided to correspond to the cavity 431 and the nozzle 451 in the head unit 20 and the piezoelectric element 40 is provided to correspond to the switch 232 in FIG. 2. Therefore, a set of the piezoelectric element 40, the cavity 431, the nozzle 451, the switch 232, and the driver 30 is provided for each nozzle 451.

Figure 4:
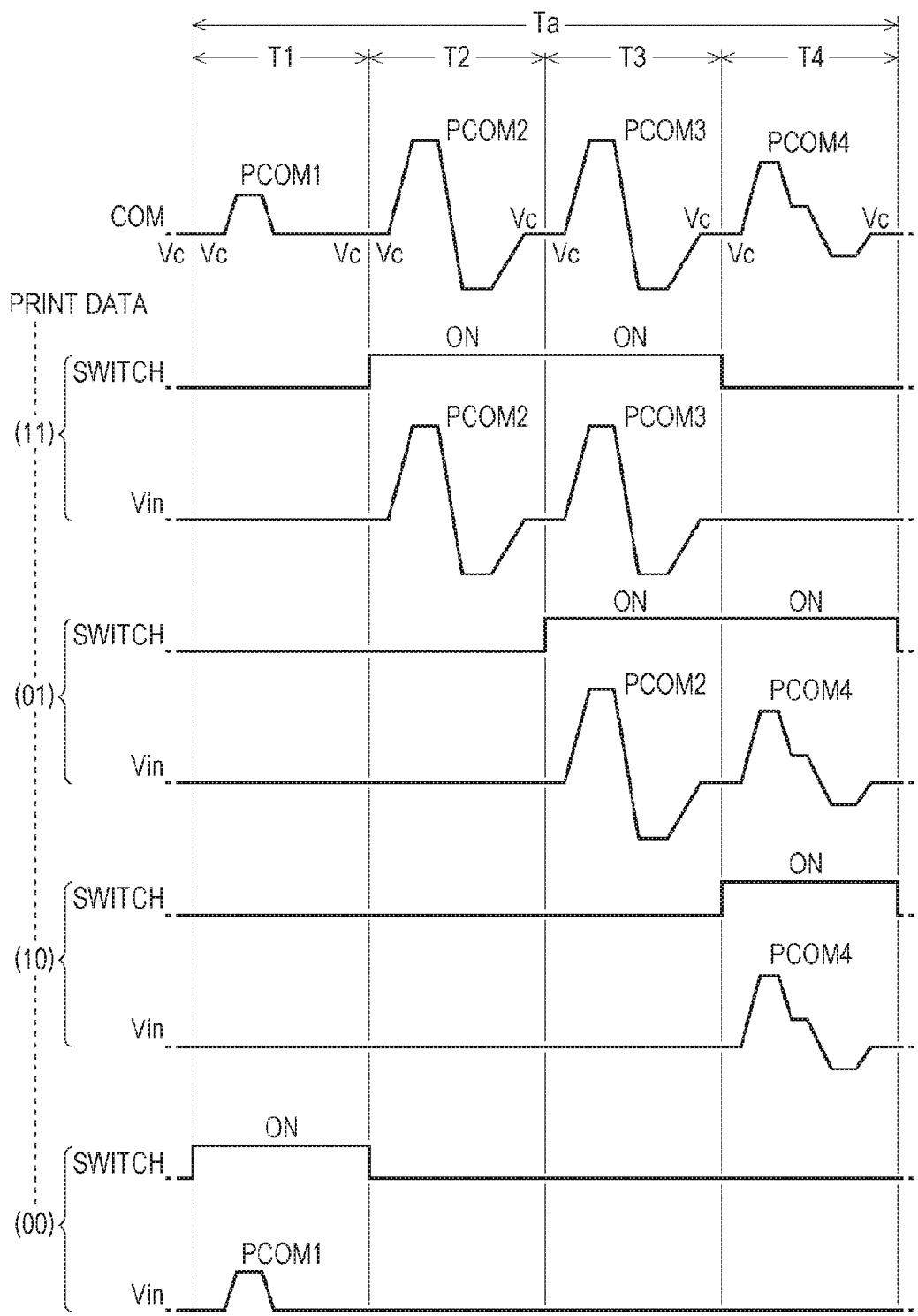

FIG. 4 is a diagram illustrating an example of the source drive signal COM or the like which is supplied to the head unit 20.

As illustrated in FIG. 4, the source drive signal COM has a waveform which is continuous with trapezoidal waveforms (pattern) PCOM1 to PCOM4 that are the minimum units of the signal that drives the piezoelectric element 40 in time series in a printing cycle Ta. The source drive signal COM is actually a waveform which is repeated with a printing cycle Ta as one cycle.

In the printing cycle Ta, the trapezoidal waveform PCOM1 is positioned in a first period T1, the trapezoidal waveform PCOM2 is positioned in a second period T2, the trapezoidal waveform PCOM3 is positioned in a third period T3, and the trapezoidal waveform PCOM4 is positioned in a fourth period T4.

The trapezoidal waveforms PCOM1 to PCOM4 have a voltage Vc at the time of each start and at the time of each end.

The trapezoidal waveforms PCOM2 and PCOM3 in the printing apparatus 1 are substantially the same as each other. When it is assumed that each of the waveforms is supplied to the piezoelectric element 40, the waveforms cause a predetermined amount, for example, a substantially medium amount of ink to be discharged from the nozzle 451.

To be more clear, the central portion of the piezoelectric element 40 is bent upward with respect to both of the end portions in accordance with the increase of the voltage, which causes the inside volume of the cavity 431 to expand, such that the ink is gathered into the cavity 431, whereas the central portion of the piezoelectric element 40 is bent downward with respect to both the end portions in accordance with the drop of the voltage, which causes the inside volume of the cavity 431 to contract, such that the ink is discharged from the nozzle 451.

In addition, the trapezoidal waveform PCOM4 is a waveform different from the trapezoidal waveform PCOM2 (PCOM3). When it is assumed that the trapezoidal waveform PCOM4 is supplied to the piezoelectric element 40, the waveform causes an amount of ink smaller than the above-described predetermined amount to be discharged from the nozzle 451.

The trapezoidal waveform PCOM1 is a waveform that causes the ink in the vicinity of the opening of the nozzle 451 to vibrate minutely and thus the viscosity of the ink is prevented from increasing. Therefore, even though the trapezoidal waveform PCOM1 is supplied to the piezoelectric element 40, no ink droplets are discharged from the nozzle 451.

Meanwhile, 2-bit print data that regulates an amount of ink (tone) to be discharged from the nozzle 451 for each pixel, a pulse that regulates a start timing of the printing cycle Ta, a pulse that regulates start timings of the periods T2, T3, and T4, or the like is supplied to the various signals that are supplied to the main controller 120.

The head controller 220 selects the source drive signal COM in accordance with the various signals supplied from the main controller 120 for each driver 30 as follows and supplies the selected source drive signal COM as the source drive signal Vin.

FIG. 4 illustrates how the source drive signal COM is selected with respect to the 2-bit print data by the head controller 220 and the selection section 230 and is supplied as the source drive signal Vin.

When the print data corresponding to a certain nozzle 451 is, for example, (11), the head controller 220 causes the switch 232 corresponding to the nozzle 451 to be ON in the periods T2 and T3. Therefore, the trapezoidal waveforms PCOM2 and PCOM3 are selected from the source drive signals COM and become the source drive signals Vin. As will be described below, the driver 30 outputs the drive signal of the voltage Vout to follow the voltage of the source drive signal Vin and drives the piezoelectric element 40 corresponding to the nozzle 451. Therefore, a substantially medium amount of ink is discharged twice corresponding to PCOM2 and PCOM3 from the nozzle 451. Accordingly, the inks land and are combined on the printing medium, and as a result, a large dot is formed.

In addition, when the print data corresponding to a certain nozzle 451 is (01), the head controller 220 causes the switch 232 corresponding to the nozzle 451 to be ON in the periods T3 and T4. Therefore, since the trapezoidal waveforms PCOM3 and PCOM4 are selected from the source drive signals COM and drive the piezoelectric element 40, a substantially medium amount and a substantially small amount of ink are discharged twice corresponding to PCOM3 and PCOM4 from the nozzle 451. Accordingly, the inks land and are combined on the printing medium, and as a result, a medium dot is formed.

Meanwhile, when the print data corresponding to a certain nozzle 451 is (10), the head controller 220 causes the switch 232 corresponding to the nozzle 451 to be ON only in the period T4. Therefore, since the trapezoidal waveform PCOM4 is selected from the source drive signals COM and drives the piezoelectric element 40, a substantially small amount of ink is discharged only once from the nozzle 451. Accordingly, a small dot is formed on the printing medium.

When the print data corresponding to a certain nozzle 451 is (00), the head controller 220 causes the switch 232 corresponding to the nozzle 451 to be ON only in the period T1. Therefore, the trapezoidal waveform PCOM1 is selected from the source drive signals COM and drives the piezoelectric element 40, but the ink in the vicinity of the opening of the nozzle 451 in the period T1 is caused to only minutely vibrate. Accordingly, since no ink is discharged, no dot is formed on the printing medium, that is, non-recording occurs.

The source drive signal COM is selected according to such print data and is supplied as the source drive signal Vin (voltage Vout) and thereby four tones of the large dot, the medium dot, the small dot, and the non-recording are expressed.

Such selection operations are executed concurrently for the nozzles 451. Further, waveforms or the like illustrated in FIG. 4 are only examples. Practically, a combination of various waveforms prepared in advance is used according to the movement speed of a carriage, properties of the printing medium, or the like.

Incidentally, when the switch 232 switches to the OFF state, a supply path of the source drive signal Vin from the output of the selection section 230 to the input of the driver 30 enters into a high impedance state. However, practically, the voltage Vc is maintained by parasitic capacitance at the time of start and end of the periods T1 to T4. Therefore, in each of the periods T1 to T4, the source drive signal Vin (voltage Vout) which is supplied to the piezoelectric element 40 becomes either the source drive signal COM (trapezoidal waveforms PCOM1 to PCOM4) or the voltage Vc which is constant.

Therefore, the voltage Vc is a voltage at the time of the start and end of the trapezoidal waveforms PCOM1 to PCOM4 and means a standby voltage in a case where the trapezoidal waveforms PCOM2 to PCOM4 are not selected.

In addition, an example in which the piezoelectric element 40 is bent upward in response to an increase of the voltage is described, but, when the voltage that is supplied to the electrodes 411 and 412 is inverted, the piezoelectric element 40 is bent downward in response to the increase of the voltage. Therefore, in a configuration in which the piezoelectric element 40 is bent downward in response to the increase of the voltage, the source drive signals COM illustrated in the drawings have waveforms inverted with the voltage Vc as a reference.

Figure 5:
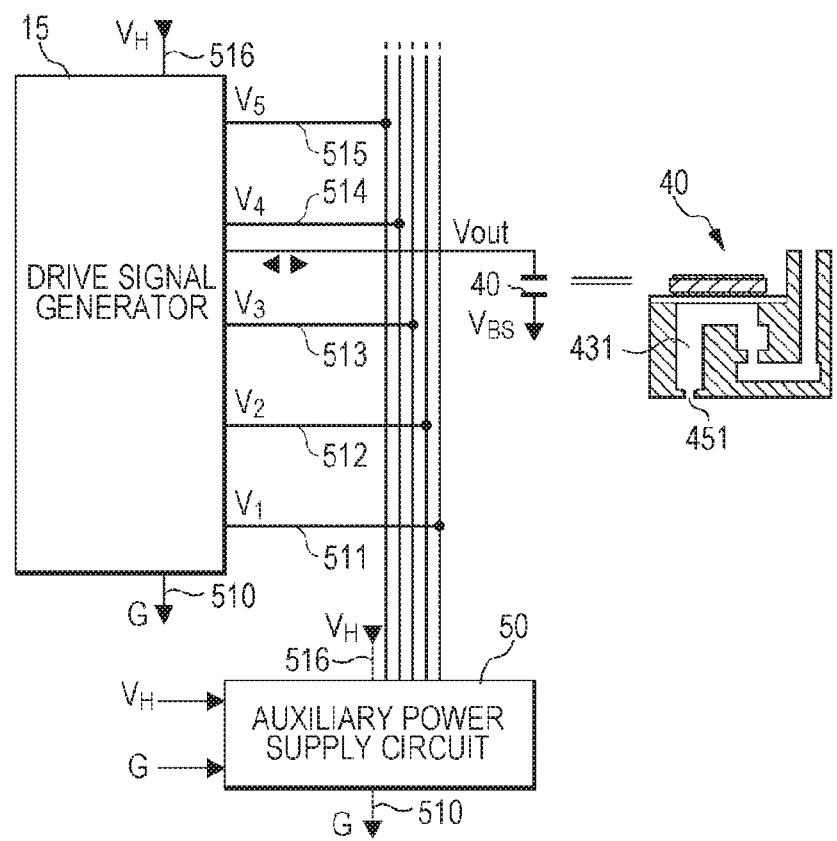
FIG. 5 is a block diagram illustrating a configuration of main components of the printing apparatus.

FIG. 5 is a block diagram illustrating a configuration of main components when focusing on a set of the driver 30 and the piezoelectric element 40 in the printing apparatus 1.

In FIG. 2, the source drive signal Vin that is supplied to the driver 30 may be a signal which is obtained by extracting the source drive signal COM converted by the DAC 160 by the ON state of the switch 232 corresponding to the driver 30, and by converting the extracted source drive signal COM into the voltage Vc by the OFF state of the switch 232. Further, the driver 30 uses the various voltages supplied from the auxiliary power supply circuit 50, outputs a drive signal of the voltage Vout according to the source drive signal Vin, and drives the piezoelectric element 40. Therefore, in FIG. 5, a source drive signal generator 15 which includes the main controller 120, the DAC 160, the selection section 230, and a single driver 30, as a single block is illustrated to be configured to supply the drive signal of the voltage Vout to one piezoelectric element 40.

The auxiliary power supply circuit 50 generates and outputs voltages $V_5$, $V_4$, $V_3$, $V_2$, and $V_1$ in descending order from the power supply voltages $V_H$ and G which are supplied from the main power supply circuit 180. Here, in the printing apparatus 1, the voltages $V_5$ to $V_1$ have relationships with the voltage $V_H$ as follows.

$$V_5 = 5V_H/6,$$

$$V_4 = 4V_H/6,$$

$$V_3 = 3V_H/6,$$

$$V_2 = 2V_H/6, \text{ and}$$

$$V_1 = 1V_H/6.$$

The voltages $V_1$ to $V_5$ are supplied to the plurality of drivers 30 through the wires 511 to 515 in the order. The voltages $V_H$ and G are supplied to the plurality of drivers 30 through the wires 516 and 510, respectively.

The piezoelectric element 40 is provided corresponding to each of the plurality of nozzles 451 in the head unit 20 and is driven by the driver 30 as a set to each other. That is, the piezoelectric element 40 is configured to be driven by the drive signal (voltage Vout) which is output from the driver 30.

Figure 6:
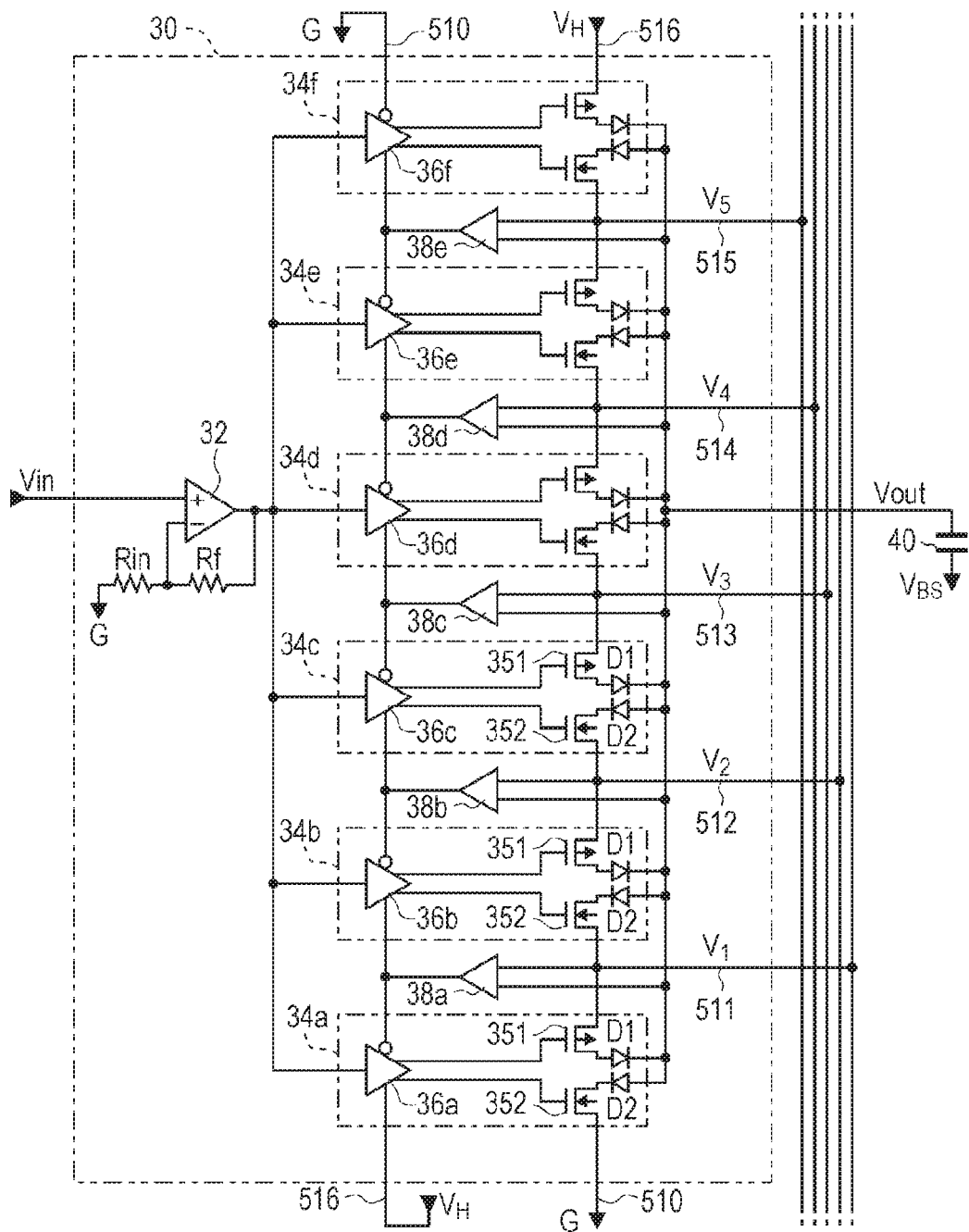
FIG. 6 is a diagram illustrating a configuration of a driver in the head unit.

FIG. 6 is a diagram illustrating an example of a configuration of the driver 30 that drives one piezoelectric element 40.

As illustrated in FIG. 6, the driver 30 includes an operational amplifier 32, unit circuits 34a to 34f, and comparators 38a to 38e, and is configured to drive the piezoelectric element 40 in accordance with the source drive signal Vin.

The source drive signal Vin selected by the selection section 230 (switch 232) is supplied to an input end (+) of the operational amplifier 32 which is the input end of the driver 30.

An output signal of the operational amplifier 32 is supplied to each of the unit circuits 34a to 34f, returns to the input end (−) of the operational amplifier 32 through resistance Rf, and grounded to the voltage G further through resistance Rin. Therefore, the operational amplifier 32 causes the source drive signal Vin to be subjected to (1+Rf/Rin) times non-inverting amplification.

A voltage amplification rate of the operational amplifier 32 can be set by the resistances Rf and Rin, and for the sake of convenience, hereinafter, Rf is set to zero and Rin is set to be infinite. That is, hereinafter, it is described that the voltage amplification rate of the operational amplifier 32 is set to "1" and the source drive signal Vin is supplied as is to the unit circuits 34a to 34f. It is needless to say that the voltage amplification rate may be other than "1".

The unit circuits 34a to 34f are provided in ascending order of the voltages corresponding to two adjacent voltages to each other from the seven types of voltages $V_H$, $V_5$ to $V_1$, and G. To be more specific, the unit circuit 34a corresponds to the voltage G and the voltage $V_1$, the unit circuit 34b corresponds to the voltage $V_1$ and the voltage $V_2$, the unit circuit 34c corresponds to the voltage $V_2$ and the voltage $V_3$, the unit circuit 34d corresponds to the voltage $V_3$ and the voltage $V_4$, the unit circuit 34e corresponds to the voltage $V_4$ and the voltage $V_5$, and the unit circuit 34f corresponds to the voltage $V_5$ and the voltage $V_H$.

Circuit configurations of the unit circuits 34a to 34f are the same as each other, and each includes one corresponding level shifter of the level shifters 36a to 36f, an N channel type metal-oxide-semiconductor field-effect transistor (MOSFET) 351, and a P channel type MOSFET 352.

Hereinafter, the MOSFET is referred to as the transistor. In addition, when the unit circuits 34a to 34f are described not specifically but generally, the unit circuits are described only with reference number "34". Similarly, when the level shifters 36a to 36f are described not specifically but generally, the level shifters are described only with reference number "36".

The level shifter 36 has either an enable status or a disable status. To be more specific, when an L-level signal is supplied to a negative control end to which a circle is attached and an H-level signal is supplied to a positive control end to which no circle is attached, the level shifter 36 enters into the enable status. Otherwise, the level shifter 36 is in the disable status.

As will be described below, the comparators 38a to 38e are each associated with the intermediate five types of voltages $V_1$ to $V_5$ of the above seven types of voltages, one to one.

Here, when a certain unit circuit 34 is focused on, an output signal of the comparator associated with a higher-side voltage of the two voltages corresponding to the unit circuit 34 is supplied to the negative control end of the level shifter 36 in the unit circuit 34. An output signal of the comparator associated with a lower-side voltage of the two voltages corresponding to the unit circuit is supplied to the positive control end of the level shifter 36.

However, while the negative control end of the level shifter 36f in the unit circuit 34f is connected to the wire 510 which supplies the voltage G (L level), the positive control end of the level shifter 36a in the unit circuit 34a is connected to the wire 516 which supplies the voltage $V_H$ (H level).

In addition, in the enable status, the level shifter 36 shifts the voltage of the source drive signal Vin by a predetermined value in a plus direction and supplies the shifted voltage to a gate electrode of the transistor 351, and concurrently, the level shifter 36 shifts the voltage of the source drive signal Vin by a predetermined value in a minus direction and supplies the shifted voltage to a gate electrode of the transistor 352.

In the disable status, regardless of the source drive signal Vin, the level shifter 36 supplies a voltage that causes the transistor 351 to be off, for example, the voltage G, to the gate electrode of the transistor 351, and concurrently, supplies a voltage that causes the transistor 352 to be on, for example, the voltage $V_H$, to gate electrode of the transistor 352.

The predetermined value is set to a voltage (threshold voltage) between the gate-source which is measured when a current starts to flow from a source electrode to a drain electrode. That is, the predetermined value is a property determined according to the characteristics of the transistors 351 and 352.

A higher-side voltage of the corresponding two voltages is supplied to the drain electrode of the transistor 351, and a lower-side voltage is supplied to the drain electrode of the transistor 352.

For example, in the unit circuit 34a corresponding to the voltage G and voltage $V_1$, the drain electrode of the transistor 351 is connected to the wire 511 of the voltage $V_1$ and the drain electrode of the transistor 352 is connected to the wire 510 of the voltage G. In addition, in the unit circuit 34b corresponding to the voltage $V_1$ and voltage $V_2$, the drain electrode of the transistor 351 is connected to the wire 512 of the voltage $V_2$ and the drain electrode of the transistor 352 is connected to the wire 511 of the voltage $V_1$. In the unit circuit 34f corresponding to the voltage $V_5$ and voltage $V_H$, the drain electrode of the transistor 351 is connected to the wire 516 of the voltage $V_H$ and the drain electrode of the transistor 352 is connected to the wire 515 of the voltage $V_5$.

In addition, the source electrodes of the transistors 351 in the unit circuits 34a to 34f are connected commonly to one end of the piezoelectric element 40 through diodes D1, respectively. In addition, the one end of the piezoelectric element 40 is connected to the source electrodes of the transistors 352 in the unit circuits 34a to 34f through diodes D2, respectively. That is, a common connection point of a cathode terminal of the diode D1 and an anode terminal of the diode D2 in the unit circuits 34a to 34f is connected to the one end of the piezoelectric element 40 as an output end of the driver 30.

A voltage of the one end of the piezoelectric element 40, that is, the voltage of the drive signal is referred to as Vout.

The comparators 38a to 38e correspond to five types of voltages $V_1$ to $V_5$, respectively, compare high and low voltages to each other supplied to two input ends and outputs a signal indicating the compared result. Here, the corresponding voltage is supplied to one end of the two input ends in the comparators 38a to 38e and the other end is connected to the output end of the driver 30, that is, the one end of the piezoelectric element 40. For example, in the comparator 38a corresponding to the voltage $V_1$, the corresponding voltage $V_1$ is supplied to one end of the two input ends and in the comparator 38b corresponding to the voltage $V_2$, the corresponding voltage $V_2$ is supplied to one end of the two input ends.

Each of the comparators 38a to 38e outputs an H-level (voltage $V_H$) signal when the voltage Vout at one end of the input end is equal to or higher than the voltage of the other end, and outputs an L-level (voltage G) signal when the voltage Vout is lower than the voltage of the other end.

Specifically, the comparator 38a outputs an H-level signal when the voltage Vout is equal to or higher than the voltage $V_1$, and outputs an L-level signal when the voltage Vout is lower than the voltage $V_1$. In addition, the comparator 38b outputs an H-level signal when the voltage Vout is equal to or higher than the voltage $V_2$, and outputs an L-level signal when the voltage Vout is lower than the voltage $V_2$.

When a voltage is focused on of the five types of voltages, the configuration is the same as above in that the output signal from the comparator corresponding to the focused-on voltage is supplied to both of a negative input end of the level shifter 36 of the unit circuit in which the voltage becomes the higher-side voltage and a positive input end of the level shifter 36 of the unit circuit in which the voltage becomes the lower-side voltage.

For example, the output signal from the comparator 38a corresponding to the voltage $V_1$ is supplied to both of a negative input end of the level shifter 36a of the unit circuit 34a with which the voltage $V_1$ is associated as the higher-side voltage and a positive input end of the level shifter 36b of the unit circuit 34b with which the voltage $V_1$ is associated as the lower-side voltage. In addition, the output signal from the comparator 38b corresponding to the voltage $V_2$ is supplied to both of a negative input end of the level shifter 36b of the unit circuit 34b with which the voltage $V_2$ is associated as the higher-side voltage and a positive input end of the level shifter 36c of the unit circuit 34c with which the voltage $V_2$ is associated as the lower-side voltage.

Next, the operation of the driver 30 will be described.

First, a description of checking the statuses of the level shifters 36a to 36f with respect to the voltage Vout at the one end of the piezoelectric element 40 is provided.

First, when a status in which the voltage Vout is equal to or higher than the voltage G and less than the voltage $V_1$ is conveniently referred to as a first status, the output signals from the comparators 38a to 38e all have the L level in the first status. Therefore, in the first status, only the level shifter 36a is in the enable status and the other level shifters 36b to 36f are in the disable status.

When a status in which the voltage Vout is equal to or higher than the voltage $V_1$ and lower than the voltage $V_2$ is referred to as a second status, only the output signal from the comparator 38b becomes the H level in the second status and the output signals from the other comparators become the L level. Accordingly, in the second status, only the level shifter 36b is in the enable status and the other level shifters 36a and 36c to 36f are in the disable status.

Hereinafter, in a third status in which the voltage Vout is equal to or higher than the voltage $V_2$ and lower than the voltage $V_3$, only the level shifter 36c is in the enable status. In a fourth status in which the voltage Vout is equal to or higher than the voltage $V_3$ and lower than the voltage $V_4$, only the level shifter 36d is in the enable status. In a fifth status in which the voltage Vout is equal to or higher than the voltage $V_4$ and lower than the voltage $V_5$, only the level shifter 36e is in the enable status. In a sixth status in which the voltage Vout is equal to or higher than the voltage $V_5$ and lower than the voltage $V_H$, only the level shifter 36f is in the enable status.

When the level shifter 36a is in the enable status in the first status, the level shifter 36a supplies a voltage signal, on which the level shifting of the source drive signal Vin by a predetermined value is performed in the plus direction, to the gate electrode of the transistor 351 in the unit circuit 34a, and supplies a voltage signal, on which the level shifting of the source drive signal Vin by the predetermined value is performed in the minus direction, to the gate electrode of the transistor 352 in the unit circuit 34a.

Here, when the voltage of the source drive signal Vin is higher than the voltage Vout, a current in accordance with the difference (from the voltage between the gate-source to the voltage that is higher by the predetermined value) flows from the drain electrode of the transistor 351 to the source electrode thereof in the unit circuit 34a. Therefore, when the voltage Vout is gradually increased and approaches the voltage of the source drive signal Vin and eventually the voltage Vout reaches the voltage of the source drive signal Vin, the current flowing to the transistor 351 becomes zero at this time.

In the description, an amount of voltage drop in the diode D1 (D2) is disregarded and details regarding the amount of the voltage drop will be described below.

Meanwhile, when the voltage of the source drive signal Vin is lower than the voltage Vout, a current in accordance with the difference flows from the source electrode of the transistor 352 to the drain electrode thereof in the unit circuit 34a. Therefore, when the voltage Vout is gradually lowered and approaches the voltage of the source drive signal Vin and eventually the voltage Vout reaches the voltage of the source drive signal Vin, the current flowing to the transistor 352 becomes zero at this time.

Accordingly, in the first status, the transistors 351 and 352 of the unit circuit 34a execute control of the voltage Vout so as to reach the source drive signal Vin.

Since, in the first status, the level shifter 36 is in the disable status in the unit circuits 34b to 34f except for the unit circuit 34a, the voltage $V_H$ is applied to the gate electrode of the transistor 351 and the voltage G is applied to the gate electrode of the transistor 352. Therefore, since, in the first status, the transistors 351 and 352 are turned off (enter into a non-conductive status) in the unit circuits 34b to 34f, the transistors 351 and 352 are not involved in the control of the voltage Vout.

Here, the operation in the first status is described, and the operations in the second to sixth statuses are the same. To be more specific, any one of the unit circuits 34a to 34f is activated according to the voltage Vout held in the piezoelectric element 40, and the activated transistors 351 and 352 of the unit circuit 34 control the voltage Vout so as to reach the source drive signal Vin. Therefore, regarding all of the drivers 30, the voltage Vout is caused to follow the voltage of the source drive signal Vin.

Figure 7A:
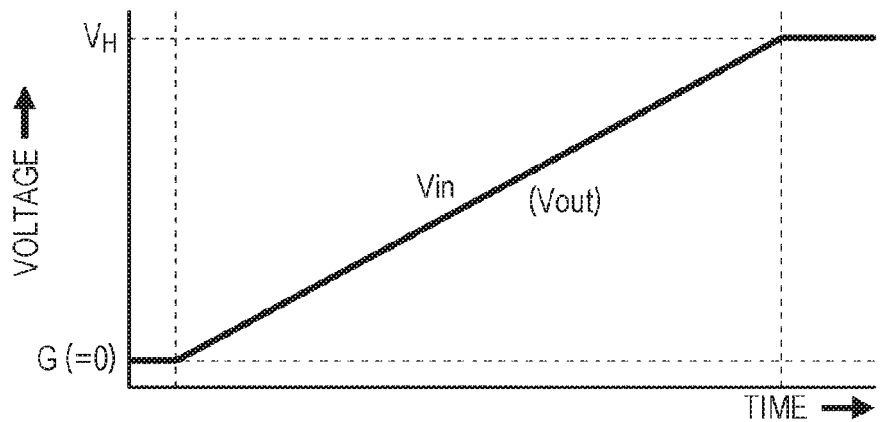
FIGS. 7A and 7B are diagrams illustrating an operational range of each level shifter in the driver.
Figure 7B:
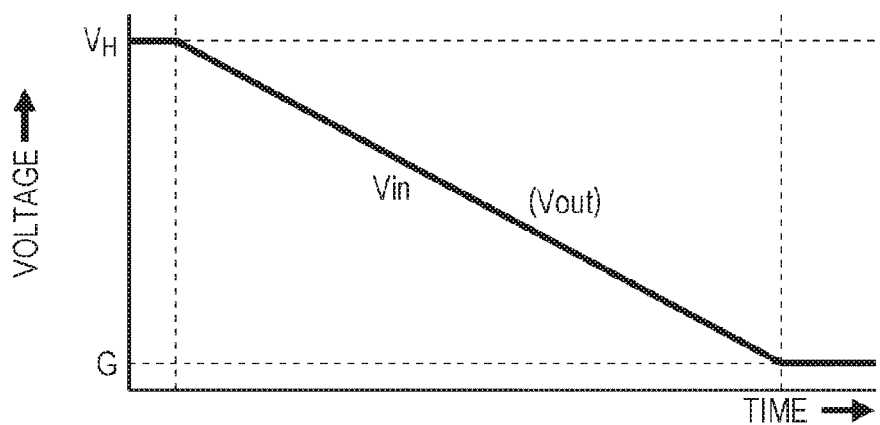

Accordingly, as illustrated in FIG. 7A, when the source drive signal Vin is increased, for example, from the voltage G to the voltage $V_H$, the voltage Vout follows the source drive signal Vin and also changes from the voltage G to voltage $V_H$. In addition, as illustrated in FIG. 7B, when the source drive signal Vin is lowered from the voltage $V_H$ to the voltage G, the voltage Vout follows the source drive signal Vin and also changes from the voltage $V_H$ to the voltage G.

Figure 8A:
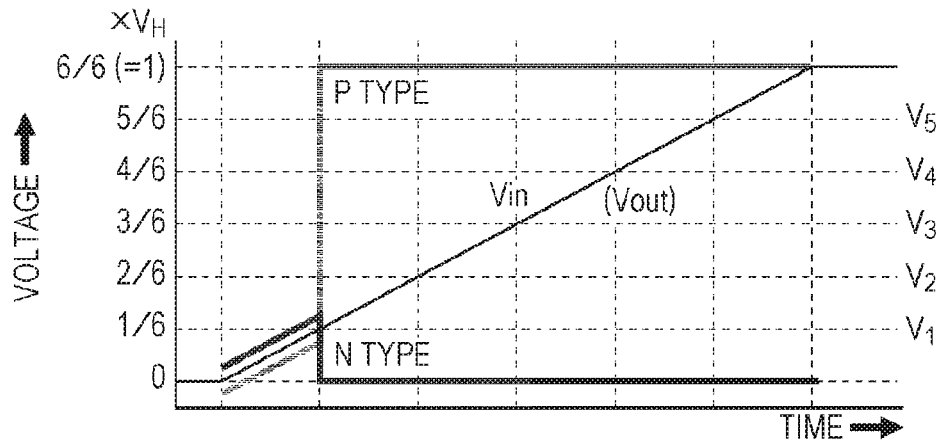
FIGS. 8A to 8C are diagrams illustrating examples of relationships between inputs and outputs in the driver.
Figure 8B:
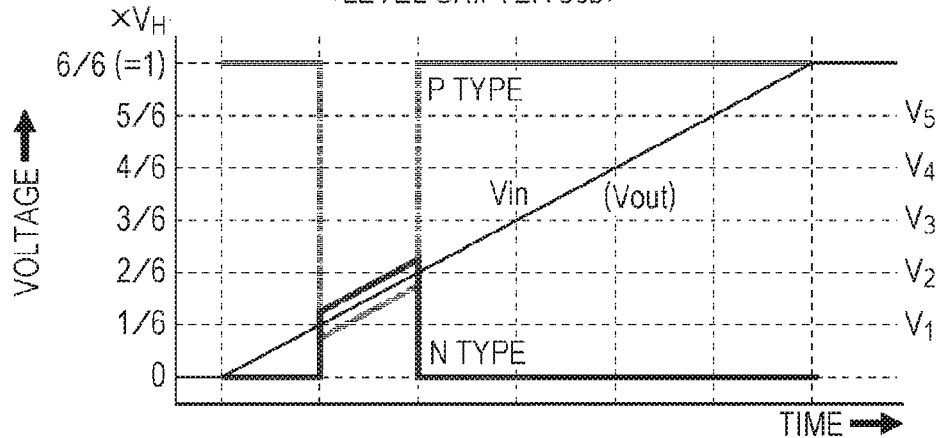
Figure 8C:
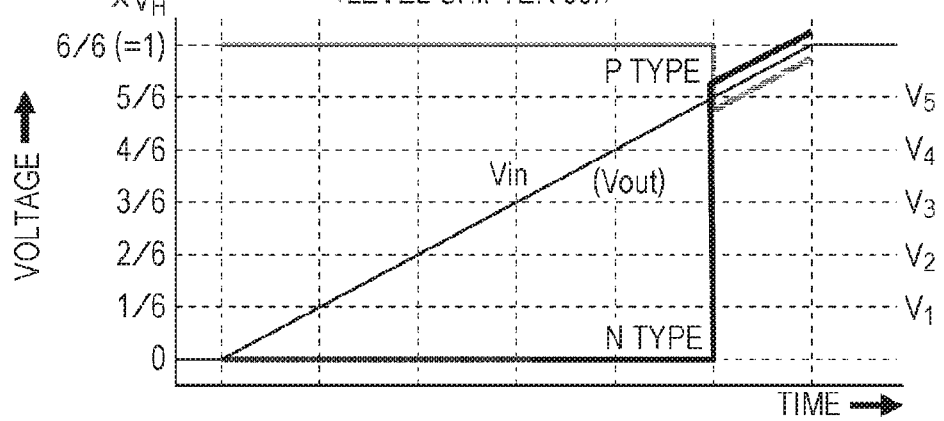

FIGS. 8A to 8C are diagrams verifiably illustrating the operation of the level shifter.

When the source drive signal Vin changes to be increased from the voltage G to voltage $V_H$, the voltage Vout is also increased and follows the source drive signal Vin. In this increasing process, in the first status in which the voltage Vout is lower than the voltage $V_1$, the level shifter 36a enters into the enable status. Therefore, as illustrated in FIG. 8A, the voltage (written as "N type") which is supplied to the gate electrode of the transistor 351 by the level shifter 36a becomes the voltage on which the shifting of the source drive signal Vin by the predetermined value is performed in the plus direction, and the voltage (written as "P type") which is supplied to the gate electrode of the transistor 352 becomes the voltage on which the shifting of the source drive signal Vin by the predetermined value is performed in the minus direction. Meanwhile, in the statuses other than the first status, since the level shifter 36a is in the disable status, the voltage that is supplied to the gate electrode of the transistor 351 becomes G and the voltage that is supplied to the gate electrode of the transistor 352 becomes $V_H$.

FIG. 8B illustrates a voltage waveform output from the level shifter 36b and FIG. 8C illustrates a voltage waveform output from the level shifter 36f. When it is considered that the level shifter 36b enters into the enable status in the second status in which the voltage Vout is equal to or higher than the voltage $V_1$ and lower than the voltage $V_2$, and the level shifter 36f enters into the enable status in the sixth status in which the voltage Vout is equal to or higher than the voltage $V_5$ and lower than the voltage $V_H$, a specific description is not necessary.

In addition, a description of the operations of the level shifters 36c to 36e in the process of increasing the voltage (or voltage Vout) of the source drive signal Vin or a description of the operations of the level shifters 36a to 36f in the process of lowering the voltage (or voltage Vout) of the source drive signal Vin is omitted.

Next, flow of the current (charge) in the unit circuits 34a to 34f will be described with examples of the unit circuits 34a and 34b both during charging and during discharging of the piezoelectric element 40.

Figure 9:
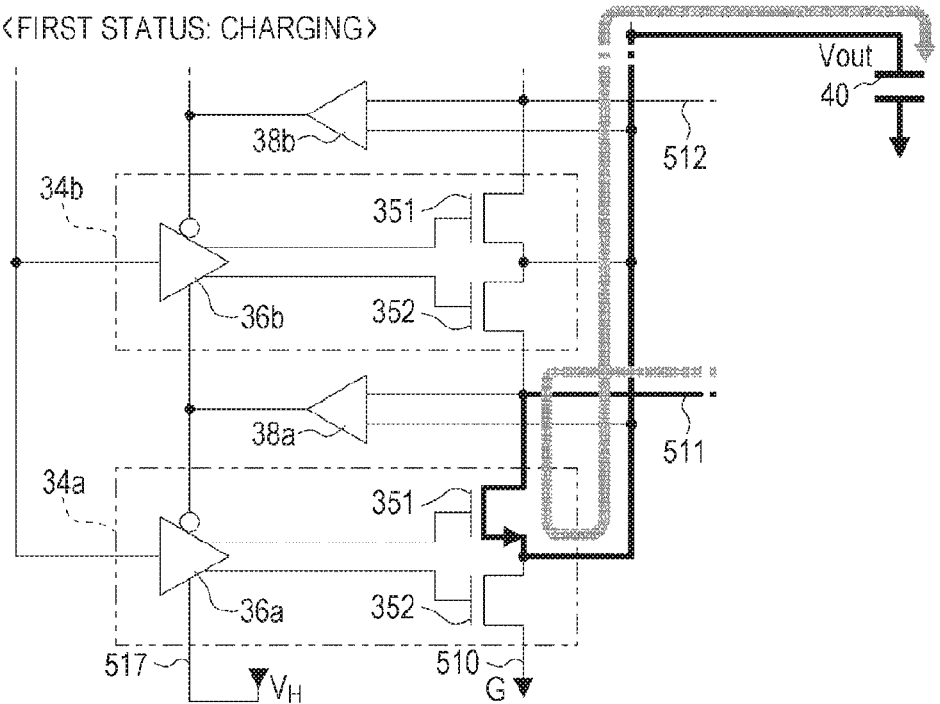
FIG. 9 is a diagram illustrating flow of a current in the driver.

FIG. 9 is a diagram illustrating the operation of the piezoelectric element 40 which is charged in the first status (status in which the voltage Vout is lower than the voltage $V_1$).

Since, in the first status, the level shifter 36a enters into the enable status and the other level shifters 36b to 36f are in the disable status, only the unit circuit 34a may be focused on.

When the voltage of the source drive signal Vin is higher than the voltage Vout in the first status, the transistor 351 of the unit circuit 34a causes the current to flow in accordance with the voltage between the gate-source. Meanwhile, the transistor 352 of the unit circuit 34a is in the OFF state.

During the charging in the first status, the current flows through a path from the wire 511 through the transistor 351 (of the unit circuit 34a) to the piezoelectric element 40 as illustrated by an arrow in FIG. 9 such that the piezoelectric element 40 is charged with the charge. The voltage Vout is increased by the charging. Eventually, when the voltage Vout approaches and reaches the voltage of the source drive signal Vin, the transistor 351 of the unit circuit 34a enters into the OFF state and thus the charging of the piezoelectric element 40 is stopped.

Meanwhile, in a case where the source drive signal Vin is increased to be equal to or higher than the voltage $V_1$, the voltage Vout follows the source drive signal Vin and also becomes equal to or higher than the voltage $V_1$. Therefore, the status transitions from the first status to the second status (status in which the voltage Vout is equal to or higher than the voltage $V_1$ and lower than the voltage $V_2$).

Figure 10:
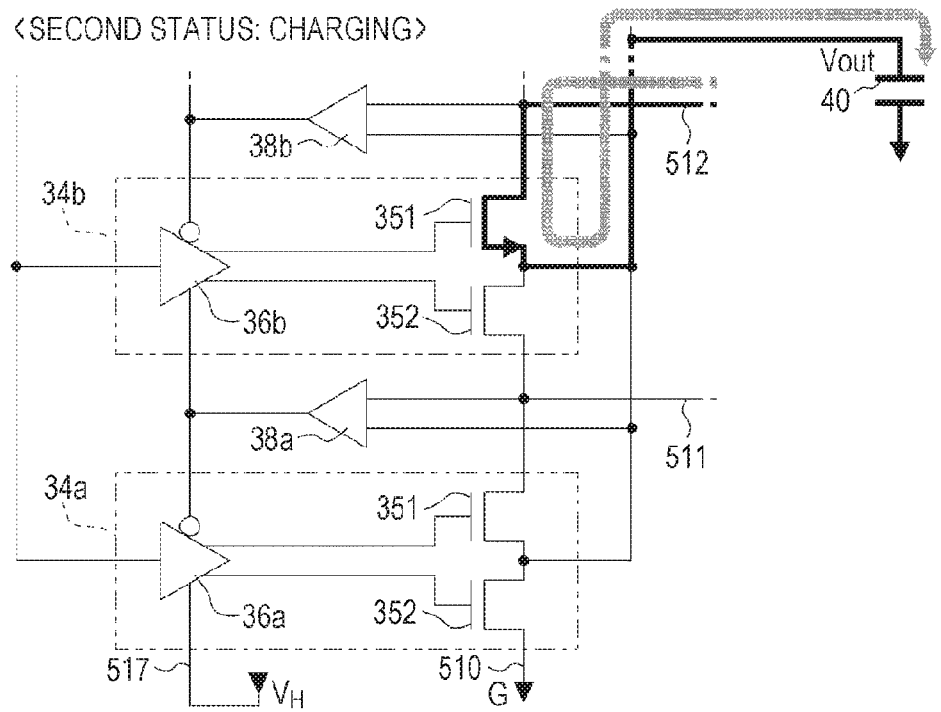
FIG. 10 is a diagram illustrating flow of the current in the driver.

FIG. 10 is a diagram illustrating the operation of the piezoelectric element 40 which is charged in the second status.

In the second status, since the level shifter 36b enters into the enable status and the other level shifters 36a and 36c to 36f are in the disable status, only the unit circuit 34b may be focused on.

When the voltage of the source drive signal Vin is higher than the voltage Vout in the second status, the transistor 351 of the unit circuit 34b causes the current to flow in accordance with the voltage between the gate-source. Meanwhile, the transistor 352 of the unit circuit 34b is in the OFF state.

During the charging in the second status, the current flows through a path from the wire 512 through the transistor 351 (of the unit circuit 34b) to the piezoelectric element 40 as illustrated by an arrow in FIG. 10 such that the piezoelectric element 40 is charged with the charge. That is, in a case where the piezoelectric element 40 is charged in the second status, one end of the piezoelectric element 40 is electrically connected to the auxiliary power supply circuit 50 through the wire 512.

When the status transitions from the first status to the second status during the increase of the voltage Vout, a current supplying source switches from the wire 511 to the wire 512.

Eventually, when the voltage Vout approaches and reaches the voltage of the source drive signal Vin, the transistor 351 of the unit circuit 34b enters into the OFF state and thus the charging of the piezoelectric element 40 is stopped.

Meanwhile, in a case where the source drive signal Vin is increased to be equal to or higher than the voltage $V_2$, the voltage Vout also follows the source drive signal Vin and becomes equal to or higher than the voltage $V_2$. As a result, the status transitions from the second status to the third status (status in which the voltage Vout is equal to or higher than the voltage $V_2$ and lower than the voltage $V_3$).

Since the charging operations from the third status to the sixth status are substantially the same, the current (charge) supplying sources switch to wires 513, 514, 515, and 516 sequentially (not particularly illustrated).

Figure 11:
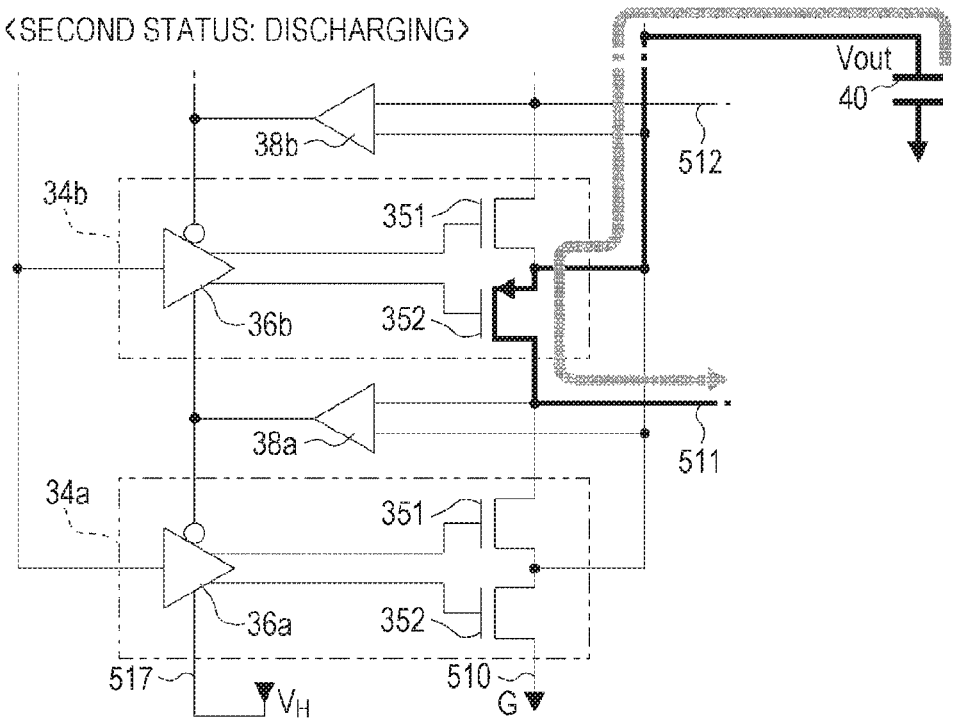
FIG. 11 is a diagram illustrating flow of the current in the driver.

FIG. 11 is a diagram illustrating the operation of the piezoelectric element 40 which is discharged in the second status.

In the second status, the level shifter 36b enters into the enable status. When the voltage of the source drive signal Vin is lower than the voltage Vout in this status, the transistor 352 of the unit circuit 34b causes the current to flow in accordance with the voltage between the gate-source. Meanwhile, the transistor 351 of the unit circuit 34b is in the OFF state.

During the discharging in the second status, the current flows through a path from the piezoelectric element 40 through the transistor 352 (of the unit circuit 34b) to the wire 511 as illustrated by an arrow in FIG. 11 such that the charge is discharged from the piezoelectric element 40. In this manner, in a case where the charge is charged in the piezoelectric element 40 in the first status, and in a case where the charge is discharged from the piezoelectric element 40 in the second status, one end of the piezoelectric element 40 is electrically connected to the auxiliary power supply circuit 50 through the wire 511. In addition, the wire 511 supplies the current (charge) during the charging in the first status and collects the current (charge) during the discharging in the second status. The collected charge is redistributed and reused by the auxiliary power supply circuit 50 as will be described below.

Eventually, when the voltage Vout approaches and reaches the voltage of the source drive signal Vin, the transistor 352 of the unit circuit 34b enters into the OFF state and thus the discharging of the piezoelectric element 40 is stopped.

Meanwhile, in a case where the source drive signal Vin is lowered to be lower than the voltage $V_1$, the voltage Vout also follows the source drive signal Vin and becomes lower than the voltage $V_1$. As a result, the status transitions from the second status to the first status.

Figure 12:
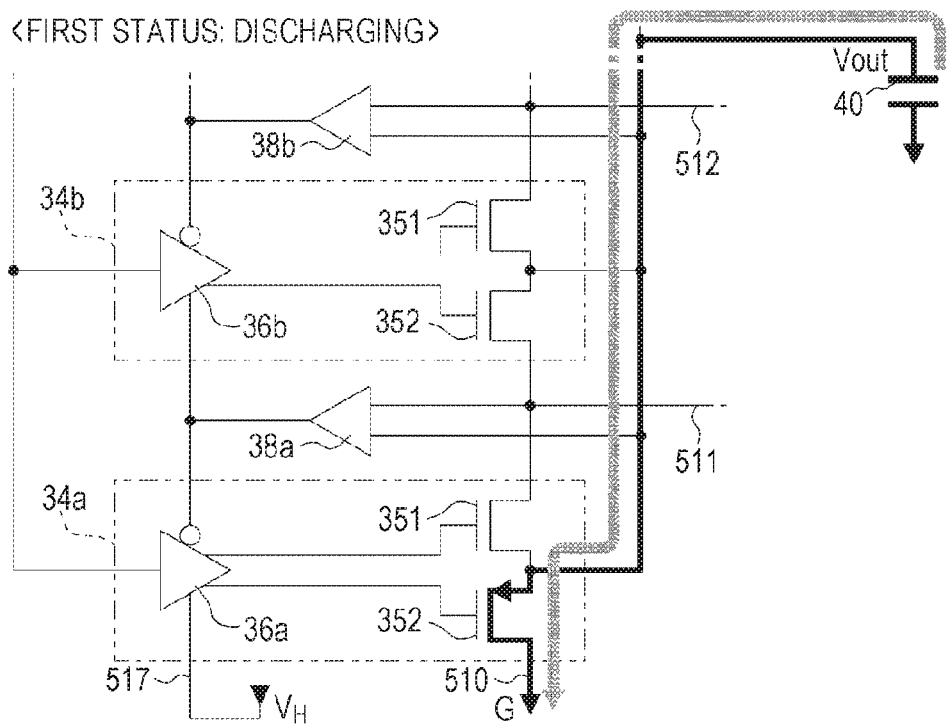
FIG. 12 is a diagram illustrating flow of the current in the driver.

FIG. 12 is a diagram illustrating the operation of the piezoelectric element 40 which is discharged in the first status.

In the first status, the level shifter 36a enters into the enable status. When the voltage of the source drive signal Vin is lower than the voltage Vout in this status, the transistor 352 of the unit circuit 34a causes the current to flow in accordance with the voltage between the gate-source.

At this time, the transistor 351 of the unit circuit 34a is in the OFF state.

During the discharging in the first status, the current flows through a path from the piezoelectric element 40 through the transistor 352 (of the unit circuit 34a) to the wire 510 as illustrated by an arrow in FIG. 12 such that the charge is discharged from the piezoelectric element 40.

Here, the unit circuits 34a and 34b are described as examples both during the charging and during the discharging. The unit circuits 34c to 34f operate in substantially the same way except that the transistors 351 and 352 which control the current are different.

In this manner, in the printing apparatus 1, the voltage Vout of the drive signal is controlled so as to follow the voltage of the source drive signal Vin.

In FIGS. 9 to 12, the diodes D1 and D2 of the unit circuits 34a and 34b are omitted and are not illustrated.

Next, the auxiliary power supply circuit 50 will be described.

Figure 13:
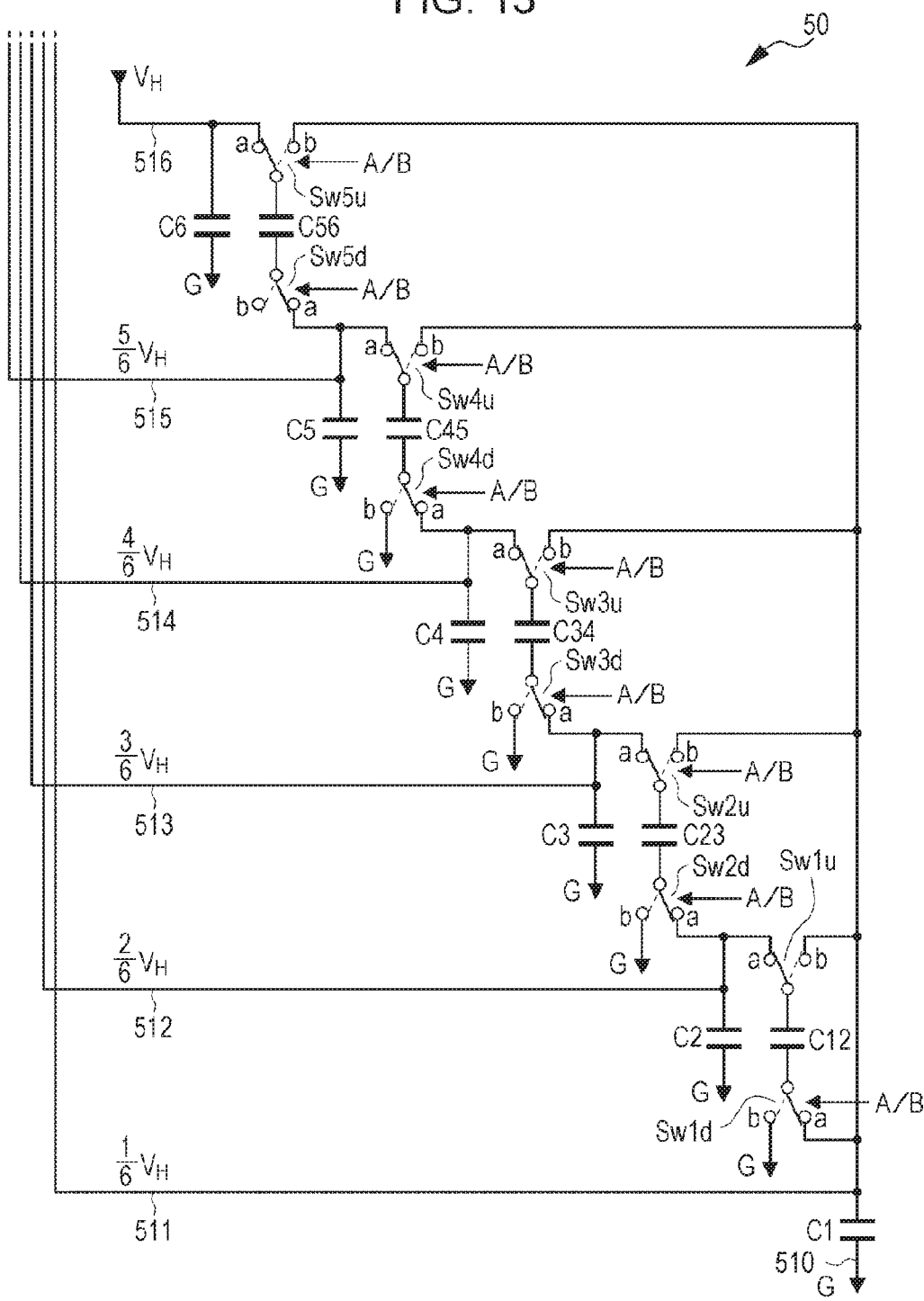
FIG. 13 is a diagram illustrating an example of an auxiliary power supply circuit.

FIG. 13 is a diagram illustrating an example of a configuration of the auxiliary power supply circuit 50.

As illustrated in FIG. 13, the auxiliary power supply circuit 50 is configured to have switches Sw5u, Sw5d, Sw4u, Sw4d, Sw3u, Sw3d, Sw2u, Sw2d, Sw1u, and Sw1d, and capacitive elements C6, C5, C4, C3, C2, C1, C56, C45, C34, C23, and C12.

Among these components, the switches are all one-pole two-throw (single pole double throw) switches and a common terminal is connected to either of terminal a or b in accordance with a control signal A/B. In a brief description, the control signal A/B is, for example, a pulse signal in which a duty ratio is substantially 50% and a frequency thereof is set to be about 20 times the frequency of the source drive signals COM. Such a control signal A/B may be generated by an internal oscillator (not illustrated) in the auxiliary power supply circuit 50 or may be supplied from the control unit 10 through the flexible cable 190.

The capacitive elements C56, C45, C34, C23, C12, and C1 are used for charge transfer. The capacitive elements C6, C5, C4, C3, C2, and C1 are used for backup. The capacitive element C1 serves as the element for both the charge transfer and the backup.

Practically, the above switches are configured by combining the transistors in a semiconductor integrated circuit, and the capacitive elements are mounted on the semiconductor integrated circuit externally. In addition, it is desirable that the semiconductor integrated circuit has a configuration in which the plurality of drivers 30 described above are formed together.

In the auxiliary power supply circuit 50, the wire 516 to which the voltage $V_H$ is applied is connected to one end of the capacitive element C6 and to a terminal a of the switch Sw5u. A common terminal of the switch Sw5u is connected to one end of the capacitive element C56 and the other end of the capacitive element C56 is connected to a common terminal of the switch Sw5d. A terminal a of the switch Sw5d is connected to one end of the capacitive element C5 and to a terminal a of the switch Sw4u. A common terminal of the switch Sw4u is connected to one end of the capacitive element C45 and the other end of the capacitive element C45 is connected to a common terminal of the switch Sw4d. A terminal a of the switch Sw4d is connected to one end of the capacitive element C4 and to a terminal a of the switch Sw3u. A common terminal of the switch Sw3u is connected to one end of the capacitive element C34 and the other end of the capacitive element C34 is connected to a common terminal of the switch Sw3d. A terminal a of the switch Sw3d is connected to one end of the capacitive element C3 and to a terminal a of the switch Sw2u. A common terminal of the switch Sw2u is connected to one end of the capacitive element C23 and the other end of the capacitive element C23 is connected to a common terminal of the switch Sw2d. A terminal a of the switch Sw2d is connected to one end of the capacitive element C2 and to a terminal a of the switch Sw1u. A common terminal of the switch Sw1u is connected to one end of the capacitive element C12 and the other end of the capacitive element C12 is connected to a common terminal of the switch Sw1d. A terminal a of the switch Sw1d is connected to one end of the capacitive element C1 and each terminal b of the switches Sw5u, Sw4u, Sw3u, Sw2u, and Sw1u. The other ends of the capacitive elements C6, C5, C4, C3, C2, and C1 and the terminals b of the switches Sw5d, Sw4d, Sw3d, Sw2d, and Sw1d are commonly grounded to the voltage G.

Figure 14A:
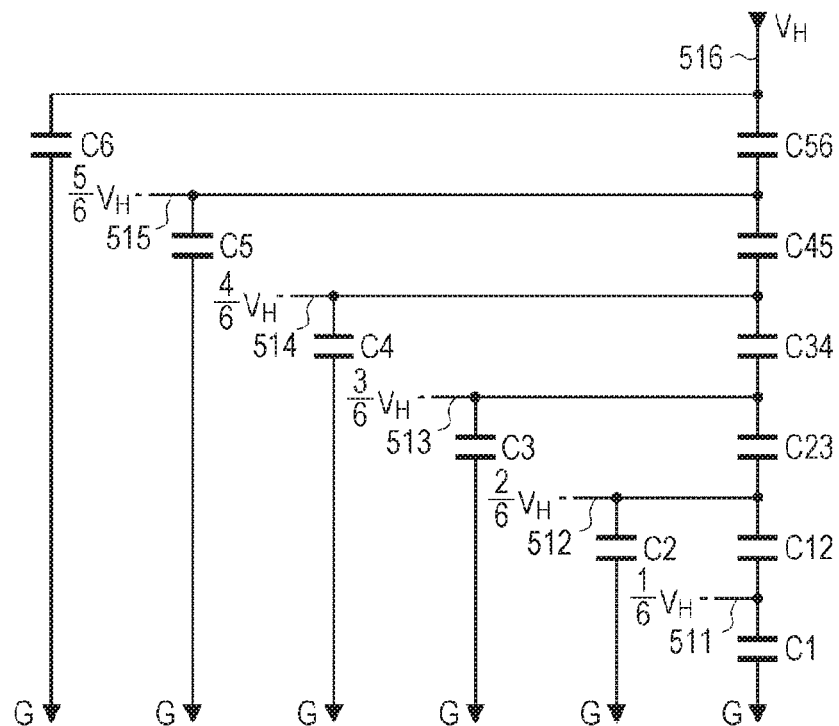
FIGS. 14A and 14B are diagrams illustrating connection of the auxiliary power supply circuit.
Figure 14B:
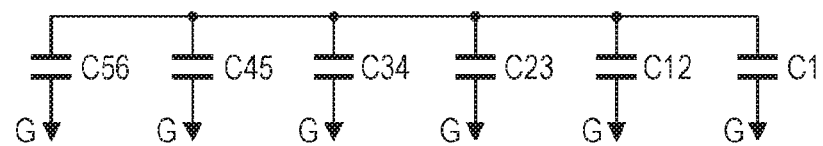

FIGS. 14A and 14B are diagrams illustrating the connection status of the switches in the auxiliary power supply circuit 50.

Each switch has two statuses of a status (status A) in which the common terminal is connected to the terminal a by the control signal A/B and a status (status B) in which the common terminal is connected to the terminal b. FIG. 14A illustrates the connection of the status A in the auxiliary power supply circuit 50 and FIG. 14B illustrates the connection of the status B by using equivalent circuits in a simplified manner, respectively.

In the status A, the capacitive elements C56, C45, C34, C23, C12, and C1 are connected in series between the voltages $V_H$ and G. Therefore, the status A may be called a series status in some cases. When capacitances in the capacitive elements C56, C45, C34, C23, C12, and C1 are the same, a hold voltage of each capacitive element becomes $V_H/6$ in the series status.

Meanwhile, in the status B, one-side ends of the capacitive elements C56, C45, C34, C23, C12, and C1 are commonly connected to one another. Therefore, the status B may be called a parallel status. In the status B, since the capacitive elements C56, C45, C34, C23, C12, and C1 are connected in parallel to one another, the hold voltage is equalized to the hold voltage $V_H/6$.

When the statuses A and B are alternately repeated, the voltage $V_H/6$ equalized in the status B becomes one to five times as high by the series connection of the status A, and is held in the capacitive elements C1 to C5, respectively. At this time, the hold voltage is supplied to the driver 30 through the wires 511 to 515. In the configuration, the voltage $V_H$ is output to the driver 30 which is connected to the wire 516.

When the piezoelectric element 40 is charged by the driver 30, the hold voltage is lowered in the capacitive elements C6 C5, C4, C3, C2, and C1 in the auxiliary power supply circuit 50. However, the capacitive element, in which the hold voltage is lowered, is replenished with a charge from the main power supply circuit 180 (refer to FIG. 2) by the series connection of the status A, and is redistributed and equalized by the parallel connection of the status B.

Meanwhile, when the piezoelectric element 40 is discharged by the driver 30, the hold voltage is increased in the capacitive elements C6 C5, C4, C3, C2, and C1. However, the charge is discharged by the series connection of the status A, and is redistributed and equalized by the parallel connection of the status B.

Accordingly, the charge discharged from the piezoelectric element 40 is collected in the auxiliary power supply circuit 50 and is reused as the charge for charging the piezoelectric element 40.

In general, when the capacitance of the capacitive load such as the piezoelectric element 40 is represented by C and the voltage amplitude is represented by E, energy P accumulated in the capacitive load is represented by $P=(C \cdot E^2)/2$.

The piezoelectric element 40 is deformed by the energy P and works, and an amount of work of discharging ink is equal to or less than 1% of the energy P. Accordingly, the piezoelectric element 40 can be considered a simple capacitor. When the capacitor C is charged with a constant power, the same energy as $(C \cdot E^2)/2$ is consumed by the charging circuit. During discharging, the same energy is also consumed by the discharging circuit.

Figure 15:
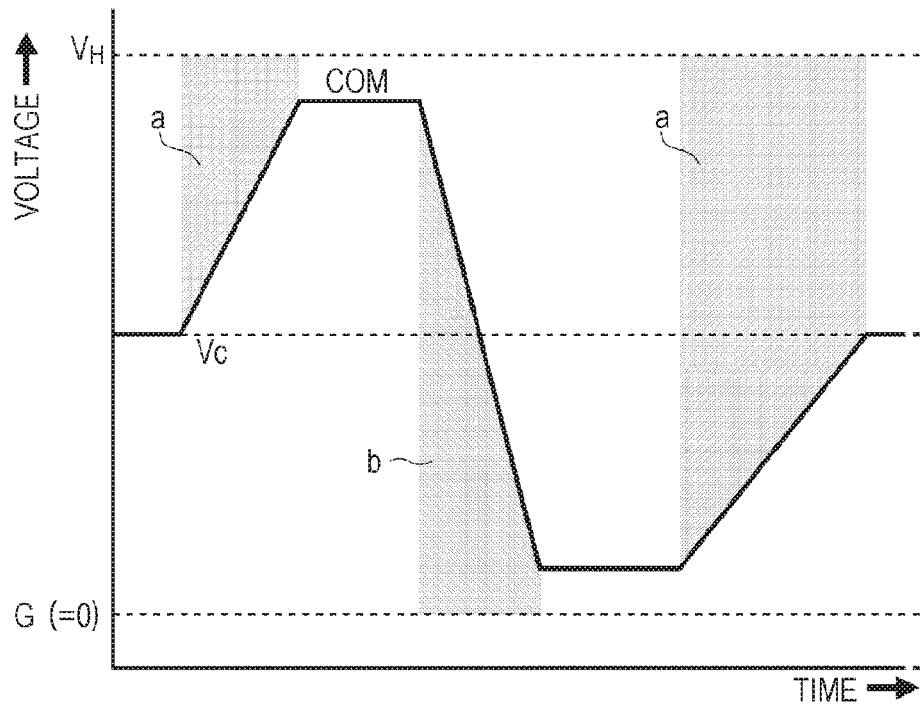
FIG. 15 is a diagram illustrating loss during charging and discharging of the piezoelectric element according to a comparative example.

Here, in a case where the source drive signal Vin changes in a range from the voltage $V_H$ to the voltage G, a configuration may be assumed, in which the piezoelectric element 40 is charged and discharged without dividing the voltage (Comparative Example). In the Comparative Example, a loss during the charging corresponds to the sum of areas of hatched regions a in FIG. 15 and a loss during the discharging corresponds to an area of a hatched region b in FIG. 15. In Comparative Example, both the loss during the charging and the loss during the discharging are great.

Figure 16:
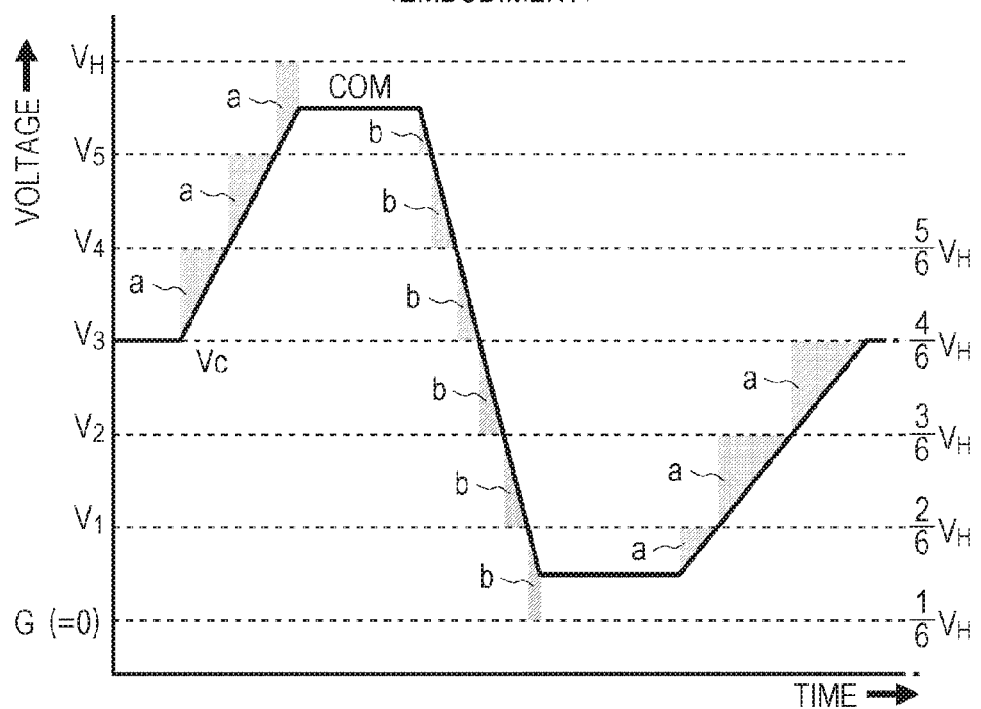
FIG. 16 is a diagram illustrating loss during charging and discharging of the piezoelectric element in the printing apparatus.

On the contrary, in the driver 30, the range from the voltage $V_H$ to voltage G is divided into six substantially equal regions and the driver 30 is configured to charge and discharge the piezoelectric element 40 in a stepwise manner. For example, when the piezoelectric element 40 is charged from the voltage G (zero) to the voltage $V_H$, the charging is performed through the following six steps: from the voltage G to the voltage $1V_H/6$; from the voltage $1V_H/6$ to the voltage $2V_H/6$; from the voltage $2V_H/6$ to the voltage $3V_H/6$; from the voltage $3V_H/6$ to the voltage $4V_H/6$; from the voltage $4V_H/6$ to the voltage $5V_H/6$; and from the voltage $5V_H/6$ to the voltage $V_H$. Therefore, the loss during the charging becomes an amount corresponding to a sum of areas of hatched regions a in FIG. 16A. Meanwhile, the discharging is performed in the stepwise manner and the loss during the discharging becomes an amount corresponding to areas of hatched regions b in FIG. 16B. Therefore, in the driver 30, it is possible to suppress the loss to be decreased during the charging and the discharging, compared to the comparative example in which the charging and the discharging are performed at a time from the voltage $V_H$ to voltage zero.

In addition, in the comparative example, the charge discharged from the piezoelectric element 40 is collected by the auxiliary power supply circuit 50 and is reused when the piezoelectric element 40 is charged. Therefore, it is possible to further suppress the loss to be decreased as a whole.

The class D amplification has higher energy efficiency compared to linear amplification. The reasons are as follows. An active element in the output stage operates in a saturated state such that little power is consumed, loss as occurring in the linear amplification does not occur during the charging by exchanging magnetic energy by an inductor L which configures a low pass filter and energy by capacitance C, and a current is recovered for electric power by current switching during the discharging.

However, in an actual class D amplification, resistance of the active element in the output stage is not zero even in the saturated state and thus, there are problems in that, in some cases, a magnetic field leaks, loss occurs due to a resistance component of the inductor L, and the inductor L is saturated during a modulation. Particularly, in a configuration in which selection is performed in the selection section 230 from common source drive signals COM and the selected source drive signals are supplied to the plurality of piezoelectric elements 40 in the head unit 20, a sum of load capacitance is not constant in terms of the source drive signal COM and thus, the inductors L which are not saturated are increased.

In the class D amplification, there are problems in that waveform quality is poorer and countermeasures of EMI are needed. Although it is possible to improve the waveform quality by adding a dummy capacitance or a filter, power consumption or cost is increased by an added amount. In the EMI, there is a fundamental problem such as switching of the class D amplification. This is because, when the switching is performed, not only the current flowing in a state of ON becomes about several times to ten times as high compared to the linear amplification, but also an amount of magnetic field which is discharged according to the high current is increased. As for a measure of the EMI, a filter needs to be added and a high cost is brought about.

In the driver 30 of the printing apparatus 1, the transistors 351 and 352 corresponding to the output stage do not perform the switching as that of the class D amplification and the inductor L is not used. Therefore, there are no problems of the poor waveform quality and the need of the countermeasures of the EMI.

In addition, the voltage Vout operates to follow the voltage of the source drive signal Vin and thus, it is possible to finely control the piezoelectric element 40.

As above, a case where the driver 30 ideally operates is described. To be more exact, the driver 30 operates in a case where resistance between drain-source of the transistors 351 and 352 is disregarded and, for example, a case where, in a state in which a transistors 351 in a certain stage use a voltage $V_N$ on the higher side in the stage and a voltage Vout which is applied to one end of the piezoelectric element 40 is high during the charging, when the voltage Vout is equal to or higher than the voltage $V_N$, the transistor 351 in the immediately upper stage uses the voltage Vout to a voltage $V_{(N+1)}$ and the voltage Vout becomes high.

Figure 17A:
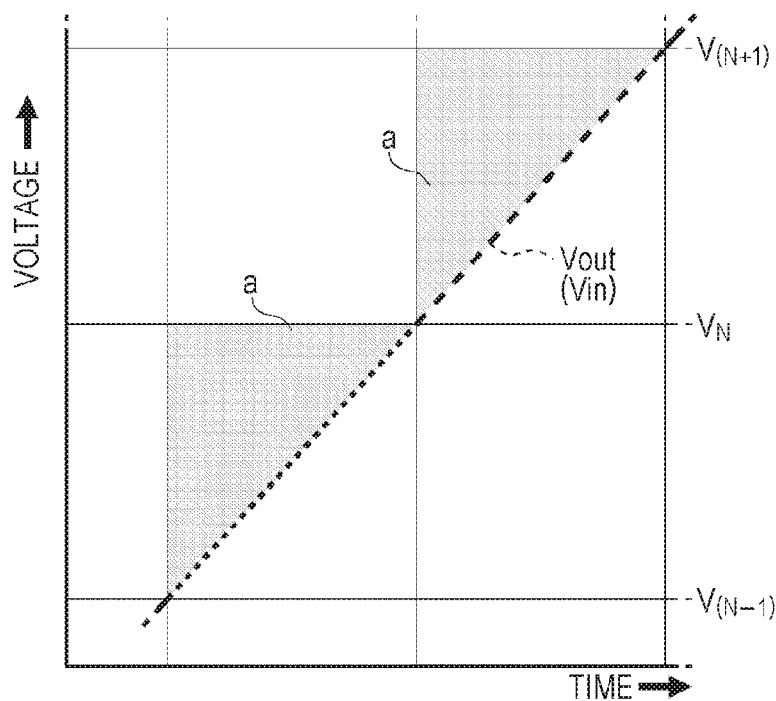
FIGS. 17A and 17B are diagrams illustrating an operation region of a transistor.
Figure 17B:
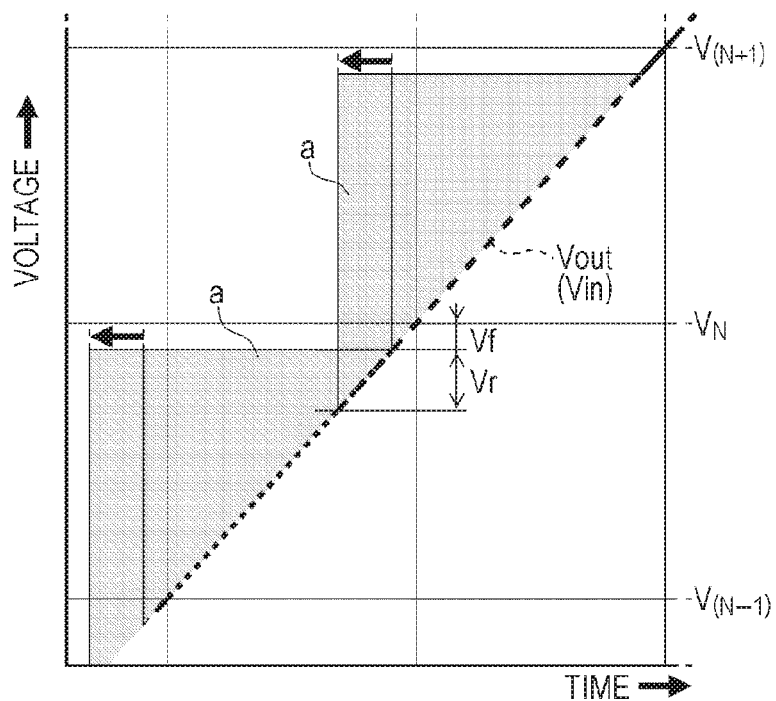

The loss during the charging is illustrated as triangle regions a in FIG. 17A as described above and the vertexes of the triangles are in contact with each other. In FIGS. 17A and 17B, the voltages $V_1$ to $V_5$ are written as $V_N$ in order to generalize the voltages $V_1$ to $V_5$.

Figure 18:
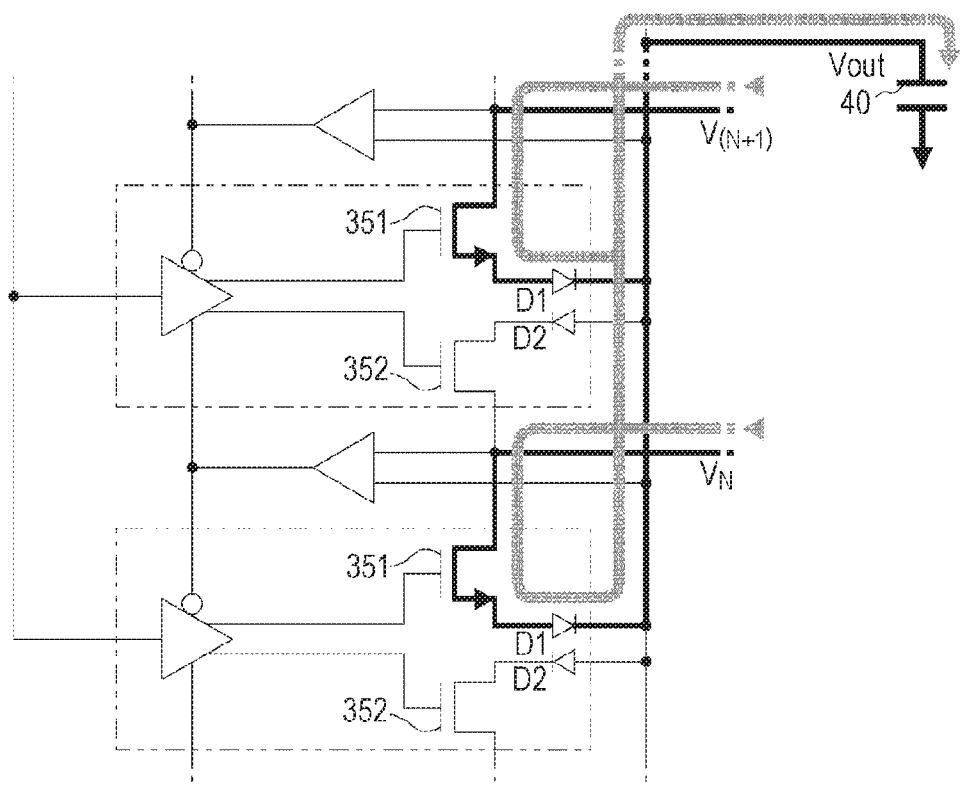
FIG. 18 is a diagram illustrating the operation region of the transistor in an overlapped region.

Practically, such an ideal operation is not performed, but a phenomenon occurs, in which a current is unlikely to flow when the voltage Vout is produced across the voltages $V_1$, $V_2$, $V_3$, $V_4$, and $V_5$. Therefore, the operation is performed such that the triangles are overlapped with each other. During the charging, only the transistor 351 in one unit circuit 34 is not used all the time but, not only the transistor 351 in the unit circuit 34 in which the voltage $V_N$ is on the higher side as illustrated in FIG. 18 when the voltage Vout becomes close to the voltage $V_N$, but also the transistor 351 in the unit circuit 34 in the immediately upper stage in which the voltage $V_{(N+1)}$ becomes the higher side is used, a current is supplied to one end of the piezoelectric element 40, and the voltage Vout becomes higher.

When the triangles are overlapped with each other, an area of each triangle itself increases, which means that the loss increases.

Next, it has to be noted that the diodes D1 and D2 provided for backflow prevention are present in the unit circuits 34a to 34f. In the above description, a forward voltage Vf (drop voltage) of the diodes D1 and D2 is set to zero, but is not zero in reality. The presence of the voltage Vf works in a direction in which the overlapped regions between the triangles in a voltage direction increase.

FIG. 17B is a diagram illustrating an operation region of the transistor 351 when taking into account the forward voltage Vf of the diodes D1 and D2.

As illustrated in FIG. 17B, the operation region of the transistor 351 of the unit circuit 34 corresponding to voltages $V_{(N-1)}$ and $V_N$ is overlapped with the immediately upper stage, that is, the operation region of the transistor 351 of the unit circuit 34 corresponding to voltages $V_N$ and $V_{(N+1)}$, by a voltage (Vf+Vr) in the voltage direction. By this overlapping, the region a of the triangle is broadened in an arrow direction and this works in a direction in which the power consumption in the driver 30 increases.

Figure 19A:
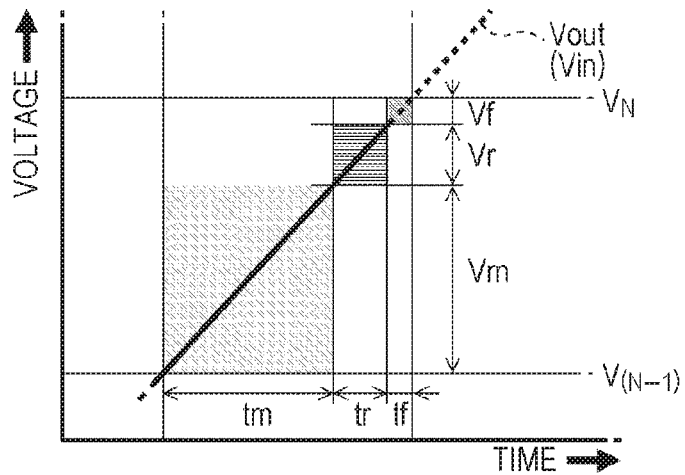
FIGS. 19A to 19C are diagrams illustrating a voltage, a current, or the like of the transistor in the overlapped region.
Figure 19B:
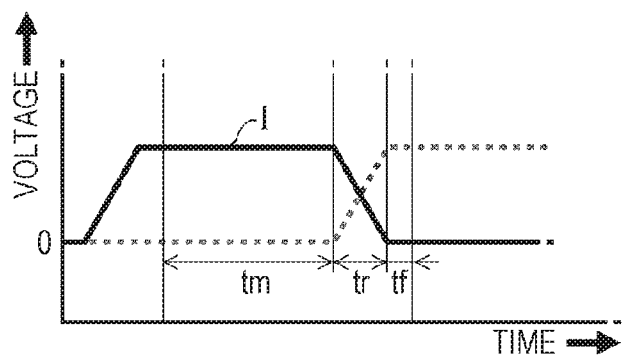
Figure 19C:
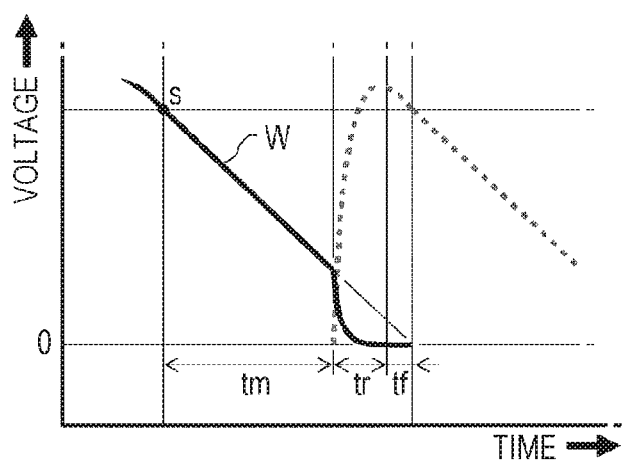

FIGS. 19A to 19C are diagrams illustrating a voltage, a current, and electric power in the operation region of the transistor 351 in the unit circuit 34 or the like corresponding to the voltages $V_{(N-1)}$ and $V_N$ in a case where the voltage Vout increases at a constant rate (a case where the piezoelectric element 40 is charged with a constant current).

In FIG. 19A, Vm represents a voltage range in which a current is supplied to one end of the piezoelectric element 40 only by the transistor 351 of the unit circuit 34 corresponding to the voltage $V_{(N-1)}$ and the voltage $V_N$ and a time range tm is shown when the range is viewed on the time axis.

Vr represents a voltage range in which a current is supplied to one end of the piezoelectric element 40 by not only the transistor 351 of the unit circuit 34 corresponding to the voltage $V_{(N-1)}$ and the voltage $V_N$ but also the transistor 351 in the immediately upper stage of the unit circuit 34 corresponding to the voltage $V_N$ and the voltage $V_{(N+1)}$ and a time range tr is shown when the range is viewed on the time axis.

Vf is a voltage of the diode D1 and represents a voltage range in which a current is supplied to one end of the piezoelectric element 40 by the transistor 351 of the unit circuit 34 corresponding to the voltage $V_N$ and the voltage $V_{(N+1)}$ in the immediately upper stage and the range corresponds to a time range tf on the time axis.

In FIG. 19B, I represents a current that flows from the drain electrode to the source electrode of the transistor 351 in the unit circuit 34 corresponding to the voltage $V_{(N-1)}$ and the voltage $V_N$.

In a case where the voltage Vout increases at a constant rate, a current I is substantially constant across the time range tm as long as the piezoelectric element 40 is a pure capacitive load. The current I decreases in the time range tr as time elapses. However, the current (refer to a dashed line) which flows from the drain electrode to the source electrode of the transistor 351 of the unit circuit 34 corresponding to the voltage $V_N$ and the voltage $V_{(N+1)}$ in the immediately upper stage increases as time elapses. Therefore, a sum of the currents flowing through in two transistors 351 is substantially constant continuing from the current I in the time range tm. In the time range tf, the current I is outside of the operation region of the transistor 351 of the unit circuit 34 corresponding to the voltage $V_{(N-1)}$ and the voltage $V_N$ and thus, the current I becomes zero.

In FIG. 19C, W represents electric power which is consumed by the transistor 351 in the unit circuit 34 corresponding to the voltages $V_{(N-1)}$ and $V_N$.

The electric power W is defined to be a product of a voltage between the drain electrode and the source electrode of the transistor 351 and the substantially constant current I in a temporal manner in the time range tm and thus, decreases linearly. The voltage between the drain electrode and the source electrode of the transistor 351 decreases as the voltage Vout increases. In addition, an s point represents electric power at a beginning end of the time range tm.

Next, in the time range tr, since the current I decreases as time elapses as illustrated in FIG. 19B, the electric power W which is the product thereof sharply decreases and becomes zero. Meanwhile, in the time range tm, in the unit circuit 34 corresponding to the voltage $V_N$ and the voltage $V_{(N+1)}$ in the immediately upper stage, both the voltage and the current between the drain electrode and the source electrode in the transistor 351 increase and thus, the electric power sharply increases as illustrated by a dashed line. In the transistor 351 of the unit circuit 34 in the immediately upper stage, the current starts to flow from a lower-side voltage than the corresponding voltage $V_N$ by the voltage (Vf+Vr). As a result, in the time range tm, the increase of the electric power consumed in the transistor 351 of the unit circuit 34 in the immediately upper stage is remarkable more than an extent of reduction of the electric power consumed in the transistor 351 of the unit circuit 34 corresponding to the voltages $V_{(N-1)}$ and $V_N$.

In the time range tf, the electric power W is out of the operation region of the transistor 351 of the unit circuit 34 corresponding to the voltage $V_{(N-1)}$ and the voltage $V_N$ and thus, the electric power W becomes zero. However, the electric power of the transistor 351 in the unit circuit 34 in the immediately upper stage increases and becomes equal to or higher than the s point.

In a case (ideal case) where the transistors are operated concurrently, the electric power in the time ranges tr and tf decreases linearly as illustrated by a fine line in FIG. 19C. However, in a case where the operation region is overlapped in the voltage range (Vf+Vr), the electric power consumed in the two transistors 351, particularly the electric power consumed in the transistor 351 in the immediately upper stage becomes great.

FIGS. 17A to 19C illustrate the charging operation of the piezoelectric element 40 and it can be said that the same is true of the discharging operation using the transistor 352 and the diode D2.

Then, in order to suppress wasteful power consumption, for example, (1) the triangular overlapped regions representing the loss is reduced, and (2) even when the two unit circuits 34 are used in the overlapped region, (preferably) the voltage on the lower side is used.

Of these ways, in order to reduce the overlapped region in (1), in addition to lowering the forward voltage Vf of the diodes D1 and D2, the resistance (resistance when the corresponding unit circuit is not in OFF state but in the enable status) between the drain-source of the transistors 351 and 352 is reduced. There is a limitation to reduction of the resistance of the transistor (hereinafter, reference numbers 351 and 352 are omitted for the sake of convenience).

First, the resistance of the transistor is examined. On the specification, when the current which is required to flow in the transistors 351 and 352 is referred to as Ireq and a lower limit resistance value R of the transistors 351 and 352 is referred to as R, $$Vr > R \cdot Ireq.$$

Since it is desirable that the size of the transistor is small when being integrated in order to decrease costs, it is necessary for the resistance R to become greater and for the overlapped portion to be greater. Therefore, the small size of the transistor is incompatible with low power consumption.

Here, when the piezoelectric element 40 is the pure capacitive load, a smallest transistor is selected according to the current Ireq and the allowable loss and the driver 30 are configured based thereon.

Figure 20:
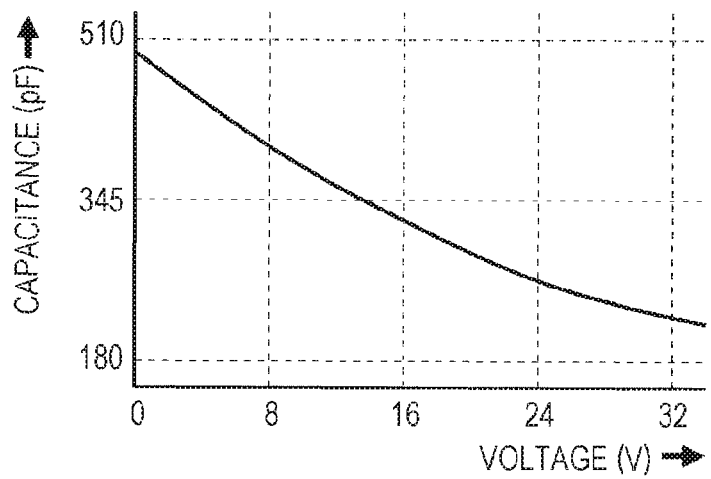
FIG. 20 is a diagram illustrating an example of voltage-capacitance characteristics in the piezoelectric element.

However, the voltage dependence is present in the actual piezoelectric element 40. For example, as illustrated in FIG. 20, the voltage dependence means that the capacitance of the piezoelectric element 40 is small when the applied voltage is high, and the capacitance is great when the applied voltage is low.

In a case where the piezoelectric element 40 has the voltage dependence, the transistors in the driver 30 are optimized by the two following ways. That is, there are (a) a way of reducing the size at an expense of the power consumption to an extent, and (b) a way of reducing the power consumption at an expense of the size to an extent.

Figure 21A:
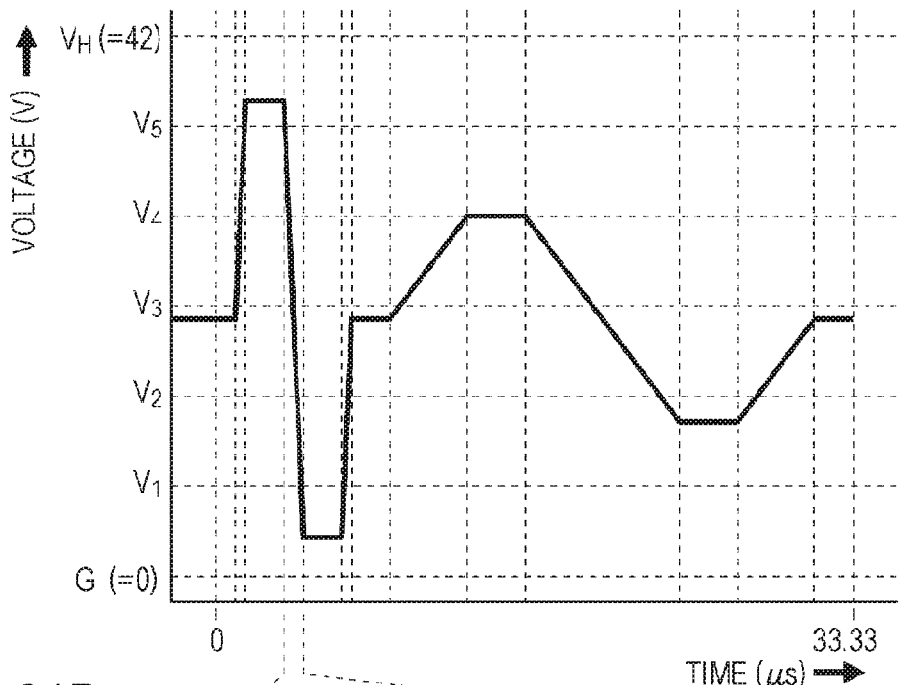
FIGS. 21A to 21C are diagrams illustrating waveforms or the like of an exemplary drive signal.
Figure 21B:
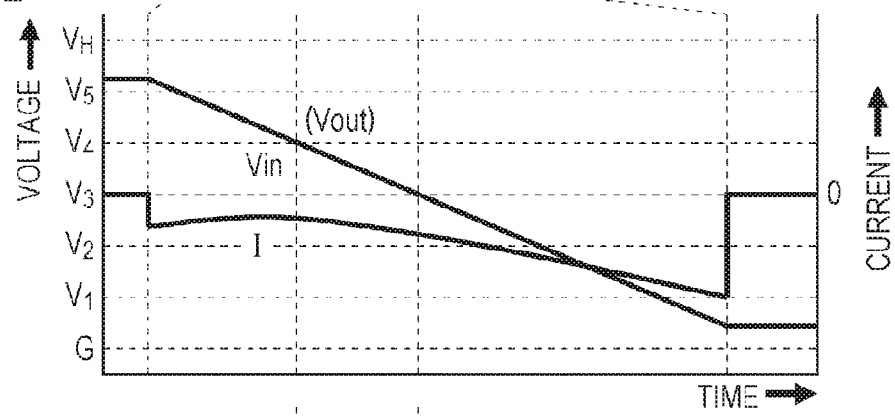

FIG. 21A is a diagram illustrating an exemplary voltage waveform of a drive signal which is used for optimization and FIG. 21B is a diagram illustrating the voltage waveform flowing in the piezoelectric element 40 corresponding to the enlarged partial voltage waveform of FIG. 21A. In a case where the applied voltage in the piezoelectric element 40 which has the voltage dependence is linearly changed, the current flowing in the piezoelectric element 40 becomes greater on the low voltage region side and becomes smaller on the high voltage region side.

Figure 21C:
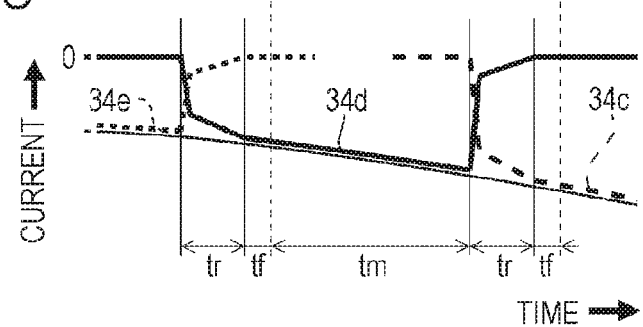

FIG. 21C is a diagram illustrating an enlarged partial voltage waveform of FIG. 21B and a diagram in which the current supplied by a single unit circuit 34 (in the drawings, unit circuit 34d corresponding to the voltages $V_3$ and $V_4$) is described to be divided from the current supplied by the adjacent unit circuits 34 (in the example in the drawings, unit circuits 34e and 34c).

As illustrated in FIG. 21C, when the current of the piezoelectric element 40 is controlled by (the transistor 352) of the unit circuit 34 in a certain stage and reaches the time range tr, the next unit circuit 34 takes part in the control. In a case where special control is not performed, the current controlled by the next unit circuit 34 becomes greater. Therefore, in the time range tr, the current control by the two unit circuits is performed together to a predetermined voltage ratio.

In a case where the unit circuit 34 in a certain stage uses the voltage $V_N$ and controls the current of the piezoelectric element 40, and when the next unit circuit 34 uses the voltage $V_{(N-1)}$ and takes part in the current control of the piezoelectric element 40, the voltage ratio is $$V_n - Vf - Vout : V_{(n-1)} - Vf - Vout.$$

For example, when the voltages $V_H$ and G are 42 volts and are divided into six (one step is seven volts) and the overlapped voltage (Vr+Vf) in the operation region is 2.4 volts, the result is 1.8:8.8 (=1:4.8) and the current from the next stage becomes four or more times as high. This is not preferable in terms of the low power consumption.

Therefore, it is necessary that even when the two unit circuits 34 are used in an overlapped region, the voltage on the lower side is used in (2) described above.

Next, (a) a way of reducing the size of the transistor, and (b) a way of reducing the power consumption are separately examined.

First, a description is provided of an example of a case where (a) the size of the transistor is optimized in a condition as follows. As the condition, in this case, the voltages $V_H$ and G are 42 volts and are divided into six (one step is seven volts), the overlapped voltage in the operation region is 2.4 volts, further, an exemplary waveform illustrated in FIG. 21A is applied as the drive signal, and further, the characteristics illustrated in FIG. 20 are applied as characteristics of the piezoelectric element 40. In addition, in voltage-resistance characteristics of the diodes D1 and D2, the resistance is zero when voltage of the voltage Vf or higher is applied in a forward direction, and the resistance is infinite when the voltage is less than the voltage Vf (practically, is represented by an exponential function).

Figure 22:
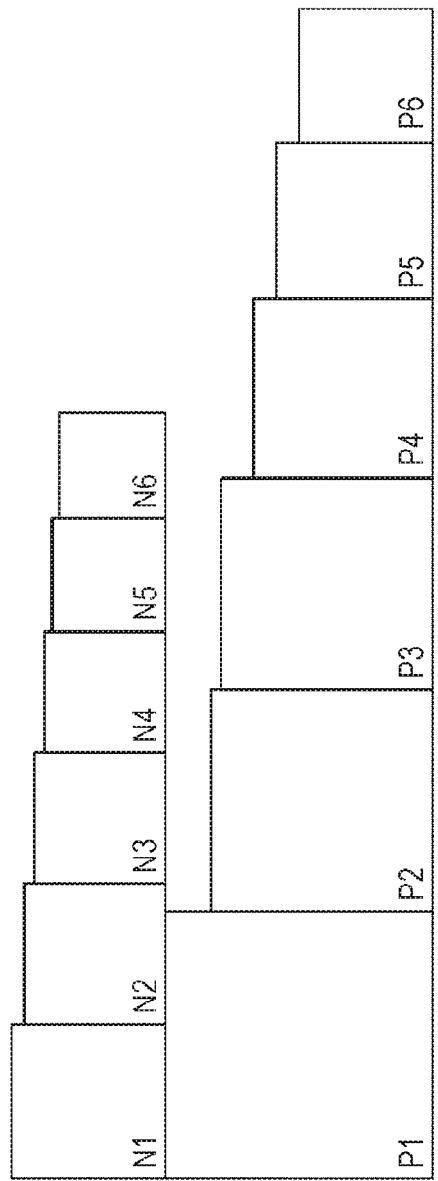
FIG. 22 is a diagram illustrating an example of sizes of the transistors.

FIG. 22 is a diagram illustrating comparison between sizes in a case where the transistors 351 and 352 of the unit circuits 34a to 34f are optimized in the above conditions.

In FIG. 22, N1 represents a size of a transistor 351 in the unit circuit 34a and is illustrated as a square such that comparison is performed. Similarly, N2 to N6 represent sizes of the transistors 352 in the unit circuits 34a to 34f. In addition, P1 to P6 represent sizes of the transistors 351 in the unit circuits 34a to 34f. The smallest transistor size is N6, that is, the transistor 351 of the unit circuit 34f corresponding to the highest potential.

In FIG. 6, the diode D1 corresponding to the transistor 351 (N6) is provided; however, the voltage Vout does not exceed the voltage $V_H$ and thus, the backflow does not occur, and the diode D1 may not be provided in reality. Accordingly, even when the transistor 351 has a small size, the transistor 351 can correspond to the current increase in the high potential.

Meanwhile, the diode D2 corresponding to the transistor 352 (P1) in the unit circuit 34a on the lowest potential is provided; however, the voltage Vout is not less than the voltage G, and thus the backflow does not occur, and the diode D2 may not be provided in reality. In FIG. 22, the size of the transistor becomes P1>P2; however, since the backflow may not be considered in P1 and it is possible to reduce the size of the transistor, depending on the condition, P1<P2.

In addition, in a case where the sizes of the transistors 351 and 352 which are included in the same unit circuit 34 are compared, the size of the N-channel type is smaller than that of the P-channel type. For example, when the sizes of the transistors 351 (N5) and 352 (P5) which are included in the unit circuit 34e are compared, N5<P5.

Next, in terms of (b) reducing power consumption, a result of simulation of the amount of the overlapped voltage in the operation region is described in a condition as follows. The condition includes that the resistance between the drain and source of the transistor becomes a constant value (200Ω). In addition, the voltage-resistance characteristics of the diodes D1 and D2 are the same as an example described above.

Figure 23A:
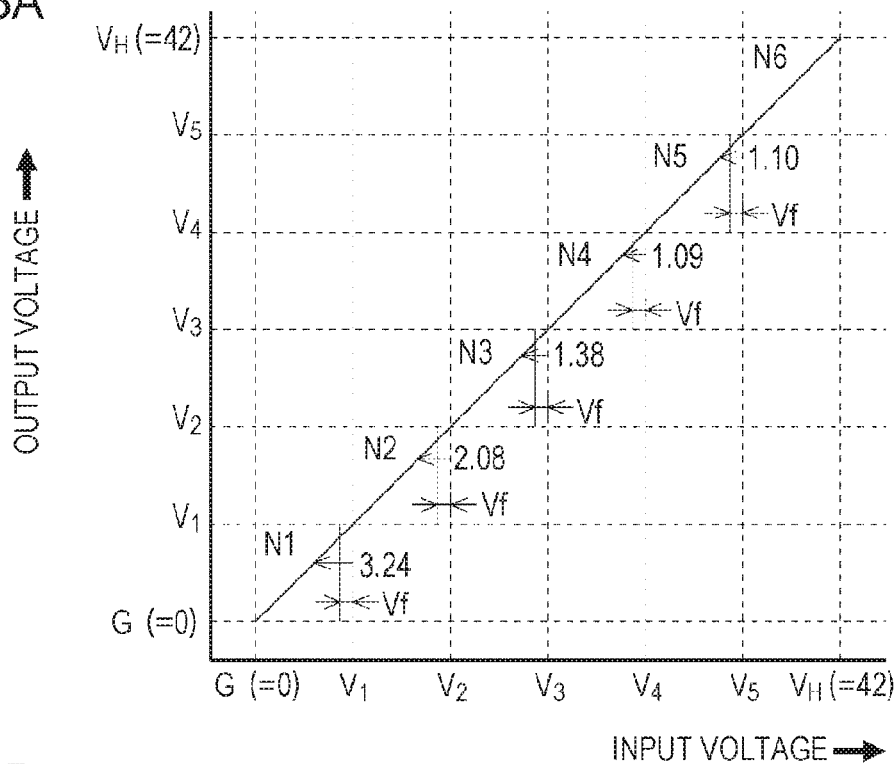
FIGS. 23A and 23B are diagrams illustrating examples of an overlapped amount of the operation region on a boundary.
Figure 23B:
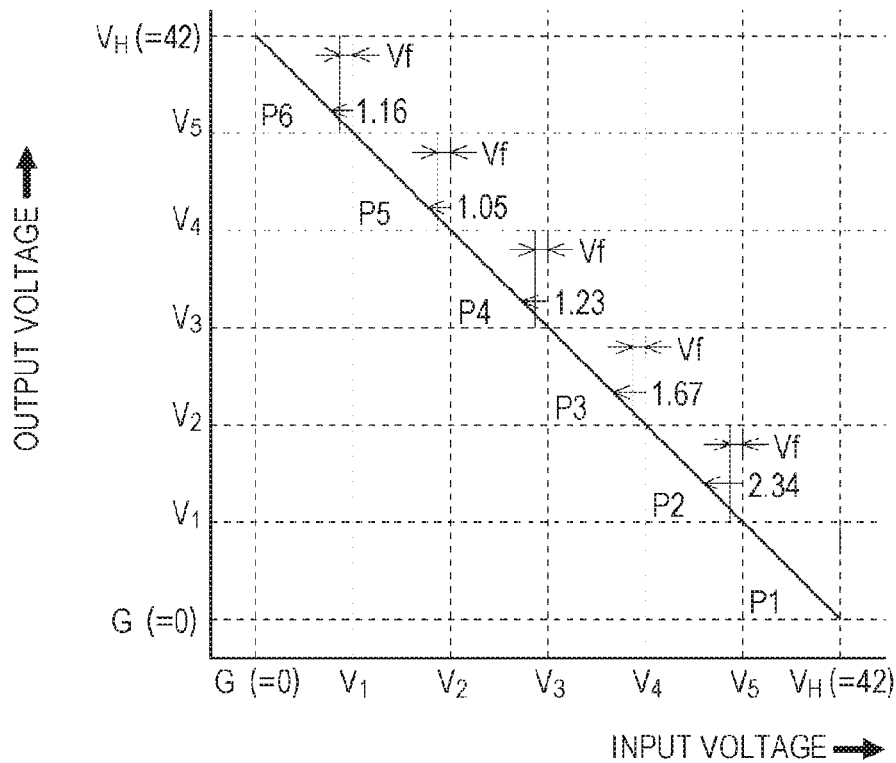

FIGS. 23A and 23B are diagrams illustrating an amount of voltage overlapped on the boundary, FIG. 23A shows the side of the transistor 351 and FIG. 23B shows the side of the transistor 352. As illustrated in FIGS. 23A and 23B, the amounts of voltages overlapped on the boundary are uneven.

As described above, in P1, the diode D2 may not be provided and the overlapped amount of N1 and N2 is greater than the overlapped amount of P1 to P2.

In this manner, when the amounts of the voltages overlapped on the boundary are separately optimized, it is possible to reduce the power consumption by substantially several percent compared to a case of uniformly setting to 2.4 volts.

In the above description, in the unit circuit 34 on each stage, the transistor 351 on the higher side which charges the piezoelectric element 40 is set to be the N channel and the transistor 352 on the lower side which discharges the piezoelectric element 40 is set to be the P channel but, the channel types may be reversed; the transistor 351 may be set to be P channel and the transistor 352 may be set to be N channel, or the two transistors may have the same channel.

It is necessary to change the output signal (gate signal) of the level shifter 36 according to the channel of the transistors 351 and 352.

In addition, in the above description, the number (number of stages) of the unit circuits 34 is "six"; however, according to the invention, the number of the unit circuits 34 is not limited thereto. While the loss during charging and discharging is decreased as the number of the unit circuits 34 is increased, the configuration becomes complicated. The capacitive load which is a drive target of the drive circuit 50 is not limited to application to the piezoelectric element that causes the liquid to be discharged but, for example, can be applied to a pulse sensor that acquires pulses using the piezoelectric element.

What is claimed is:

1. A driving circuit for driving a piezoelectric element, comprising:
   a drive signal generator that generates a drive signal which is applied to the piezoelectric element so as to eject a liquid from a nozzle, the drive signal generator including a plurality of first MOSFETs and a plurality of second MOSFETs, the plurality of first MOSFETs and the plurality of second MOSFETs being connected in pairs in series between a high potential wire having a high potential and a low potential wire having a low potential lower than the high potential so as to configure a first pair of first MOSFET and second MOSFET and a second pair of first MOSFET and second MOSFET, and a third pair of first MOSFET and second MOSFET, wherein
   at least one of the plurality of first MOSFETs and at least one of the plurality of second MOSFETs have different sizes from each other,
   the first pair of first MOSFET and second MOSFET is connected between the high potential wire and a first potential wire having a first potential, the second pair of first MOSFET and second MOSFET is connected between the first potential wire and a second potential wire having a second potential, and the third pair of first MOSFET and second MOSFET is connected between the second potential wire and the low potential wire, and
   the high potential is higher than the first potential, the first potential is higher than the second potential, and the second potential is higher than the low potential.

2. The driving circuit for driving the piezoelectric element according to claim 1,
   wherein the first MOSFET, to which the high potential wire connects, of the first pair of first MOSFET and second MOSFET has a smallest size among the plurality of first MOSFETs.

3. The driving circuit for driving the piezoelectric element according to claim 1,
   wherein only the first pair of first MOSFET and second MOSFET among the first through third pairs of first MOSFETs and second MOSFETs is configured to perform charge and discharge operations for the piezoelectric element, and
   the first MOSFET of the first pair of first MOSFET and second MOSFET is configured to perform the charge operation and the second MOSFET of the first pair of first MOSFET and second MOSFET is configured to perform the discharge operation.

4. The driving circuit for driving the piezoelectric element according to claim 3,
   wherein a size of each of the first MOSFETs of the first through third pairs of first MOSFETs and second MOSFETs is smaller than a size of each of the second MOSFETs of the first through third pairs of first MOSFETs and second MOSFETs, respectively.

5. The driving circuit for driving the piezoelectric element according to claim 3,
   wherein a size of the first MOSFET of the second pair of first MOSFET and second MOSFET is smaller than a size of the first MOSFET of the third pair of first MOSFET and second MOSFET,
   a size of the second MOSFET of the first pair of first MOSFET and second MOSFET is smaller than a size of the second MOSFET of the second pair of first MOSFET and second MOSFET, and the size of the second MOSFET of the second pair of first MOSFET and second MOSFET is smaller than a size of the second MOSFET of the third pair of first MOSFET and second MOSFET.

6. The driving circuit for driving the piezoelectric element according to claim 1,
wherein the first and second potential wires are connected to an auxiliary power supply circuit that supplies and collects charge.

7. The driving circuit for driving the piezoelectric element according to claim 1,
wherein the drive signal generator is configured to control a voltage of the drive signal by using one MOSFET in the first through third pairs of first MOSFETs and second MOSFETs based on a voltage of a source drive signal that generates the voltage of the drive signal and a hold voltage of the piezoelectric element.

8. The driving circuit for driving the piezoelectric element according to claim 7,
wherein a level shifter is provided to each of the first through third pairs of first MOSFETs and second MOSFETs, the level shifter applies, to a gate electrode of the first MOSFET, a voltage that is obtained by shifting the voltage of the source drive signal by a predetermined value to a high potential side and applies, to a gate electrode of the second MOSFET, a voltage that is obtained by shifting the voltage of the source drive signal by a predetermined value to a low potential side.

9. The driving circuit for driving the piezoelectric element according to claim 1,
wherein a size of each of the first MOSFETs of the first through third pairs of first MOSFETs and second MOSFETs is different from a size of each of the second MOSFETs of the first through third pairs of first MOSFETs and second MOSFETs, respectively.

* * * * *